(12) United States Patent
Jiang et al.

(10) Patent No.: US 12,237,280 B2
(45) Date of Patent: Feb. 25, 2025

(54) CAVITY RESONATOR FOR ENHANCING RADIO-FREQUENCY PERFORMANCE AND METHODS FOR FORMING THE SAME

(71) Applicant: Taiwan Semiconductor Manufacturing Company Limited, Hsinchu (TW)

(72) Inventors: Jheng-Hong Jiang, Hsinchu (TW); Shing-Huang Wu, Hsinchu (TW); Chia-Wei Liu, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/362,107

(22) Filed: Jul. 31, 2023

(65) Prior Publication Data

US 2023/0378104 A1  Nov. 23, 2023

Related U.S. Application Data

(62) Division of application No. 17/470,174, filed on Sep. 9, 2021, now Pat. No. 11,848,291.

(60) Provisional application No. 63/157,053, filed on Mar. 5, 2021.

(51) Int. Cl.
| | |
|---|---|
| *H01L 23/66* | (2006.01) |
| *H01L 21/768* | (2006.01) |
| *H01L 23/522* | (2006.01) |
| *H01L 49/02* | (2006.01) |

(52) U.S. Cl.
CPC ........ *H01L 23/66* (2013.01); *H01L 21/76849* (2013.01); *H01L 23/5226* (2013.01); *H01L 28/90* (2013.01); *H01L 2223/6616* (2013.01); *H01L 2223/6672* (2013.01); *H01L 2223/6688* (2013.01)

(58) Field of Classification Search
CPC ............... H01L 23/66; H01L 21/76849; H01L 23/5226; H01L 28/90; H01L 2223/6616; H01L 2223/6672; H01L 2223/6688; H01P 7/065; H01P 11/008
See application file for complete search history.

(56) References Cited

U.S. PATENT DOCUMENTS

2015/0028450 A1* 1/2015 Park .................. H01L 21/76898
257/532

* cited by examiner

*Primary Examiner* — David Vu
(74) *Attorney, Agent, or Firm* — The Marbury Law Group, PLLC

(57) ABSTRACT

Devices and methods of manufacture for a graduated, "step-like," semiconductor structure having two or more resonator trenches. A semiconductor structure may comprise a first resonator and a second resonator. The first resonator comprising a first metallic resonance layer and a capping plate having a bottom surface that is a first distance from a distal end of the first metallic resonance layer 128. The second resonator comprising a second metallic resonance layer and the capping plate, in which the bottom surface is a second distance from a from a distal end of the second metallic resonance layer 128b, and in which first distance is different from the second distance.

20 Claims, 22 Drawing Sheets

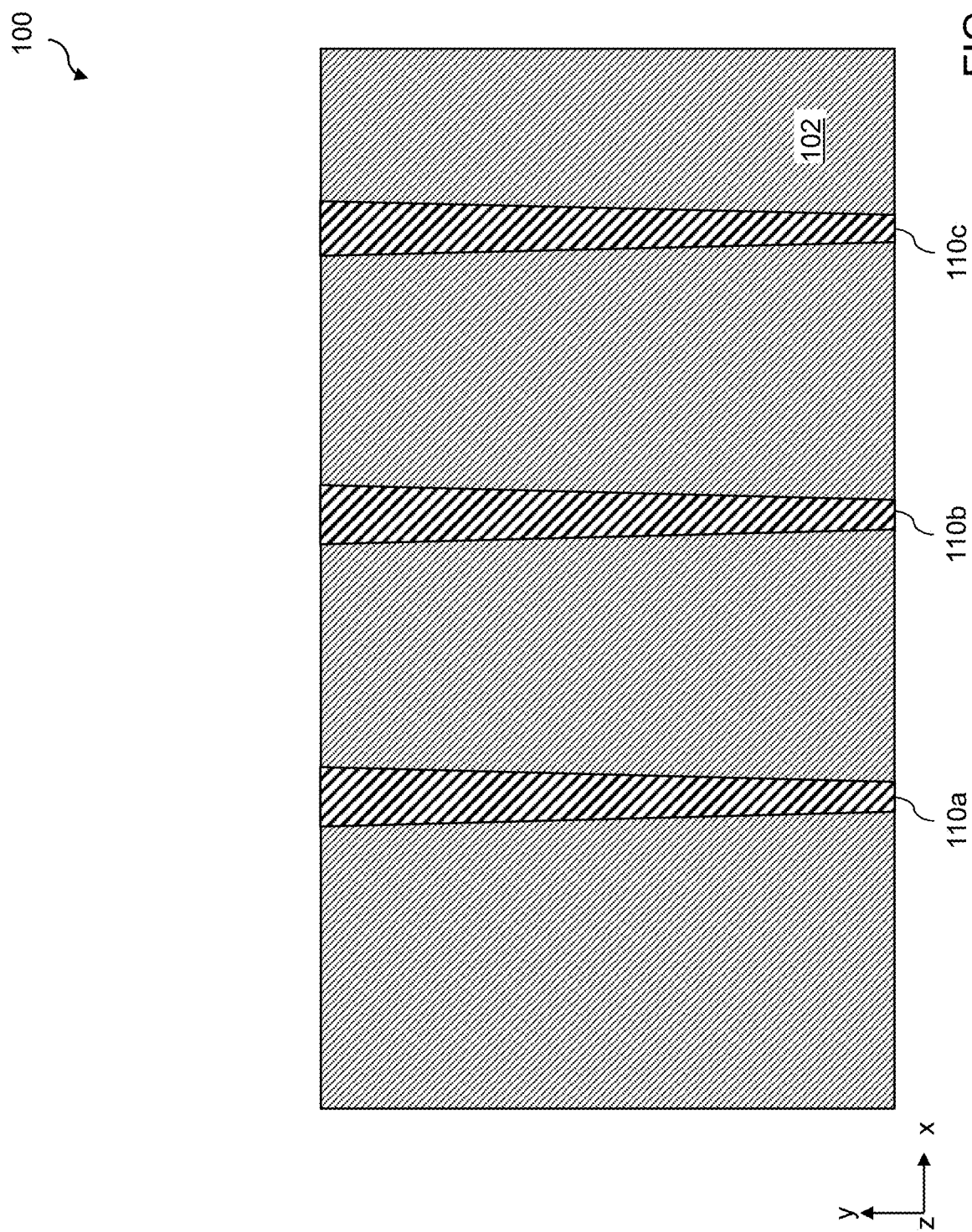

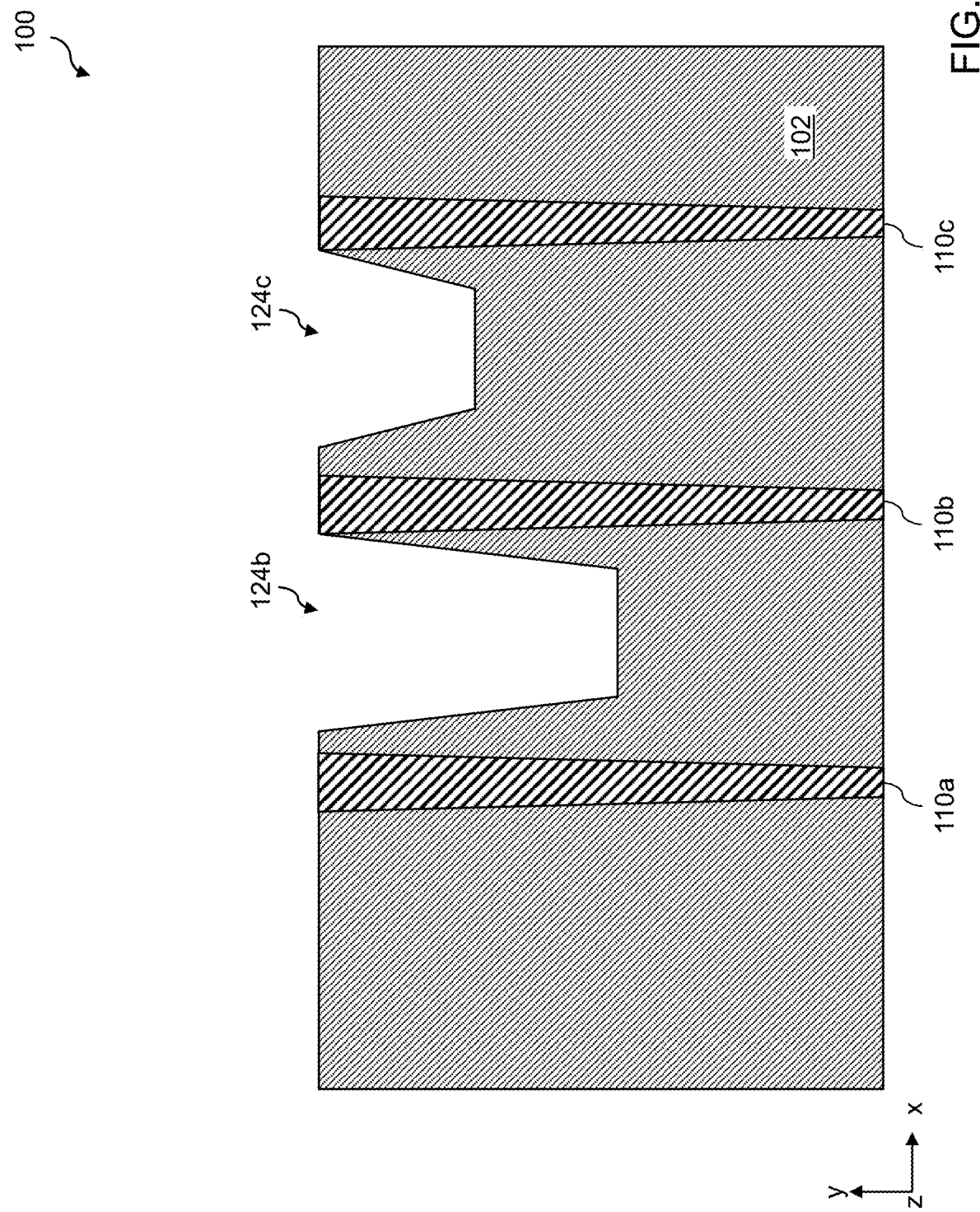

CAVITY RESONATOR FOR ENHANCING RADIO-FREQUENCY PERFORMANCE AND METHODS FOR FORMING THE SAME

RELATED APPLICATIONS

This application is a divisional application of U.S. patent application Ser. No. 17/470,174 entitled "Cavity Resonator for Enhancing Radio-Frequency Performance and Methods for Forming the Same," filed on Sep. 9, 2021, which claims priority from U.S. Provisional Patent Application No. 63/157,053 entitled "The Novel Cavity Resonator Enhance Radio-Frequency Performance" filed on Mar. 5, 2021, the entire contents of both of which are hereby incorporated by reference for all purposes.

BACKGROUND

Embedded capacitors are used in semiconductor chips for a variety of applications. However, semiconductor structures, such as radio-frequency cavity resonator structures, used in radio-frequency applications may be exposed during long manufacturing times, increasing the risk of structural damage including corrosion.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1F is a vertical cross-sectional view of the exemplary structure after deposition of a metallic fill material layer in the via cavities according to an embodiment of the present disclosure.

FIG. 1J is a vertical cross-sectional view of the exemplary structure after formation of a resonator cavity according to an embodiment of the present disclosure.

FIG. 1O is a vertical cross-sectional view of the exemplary structure after deposition of a resonator trench dielectric layer according to an embodiment of the present disclosure.

DETAILED DESCRIPTION

Figure 1A:
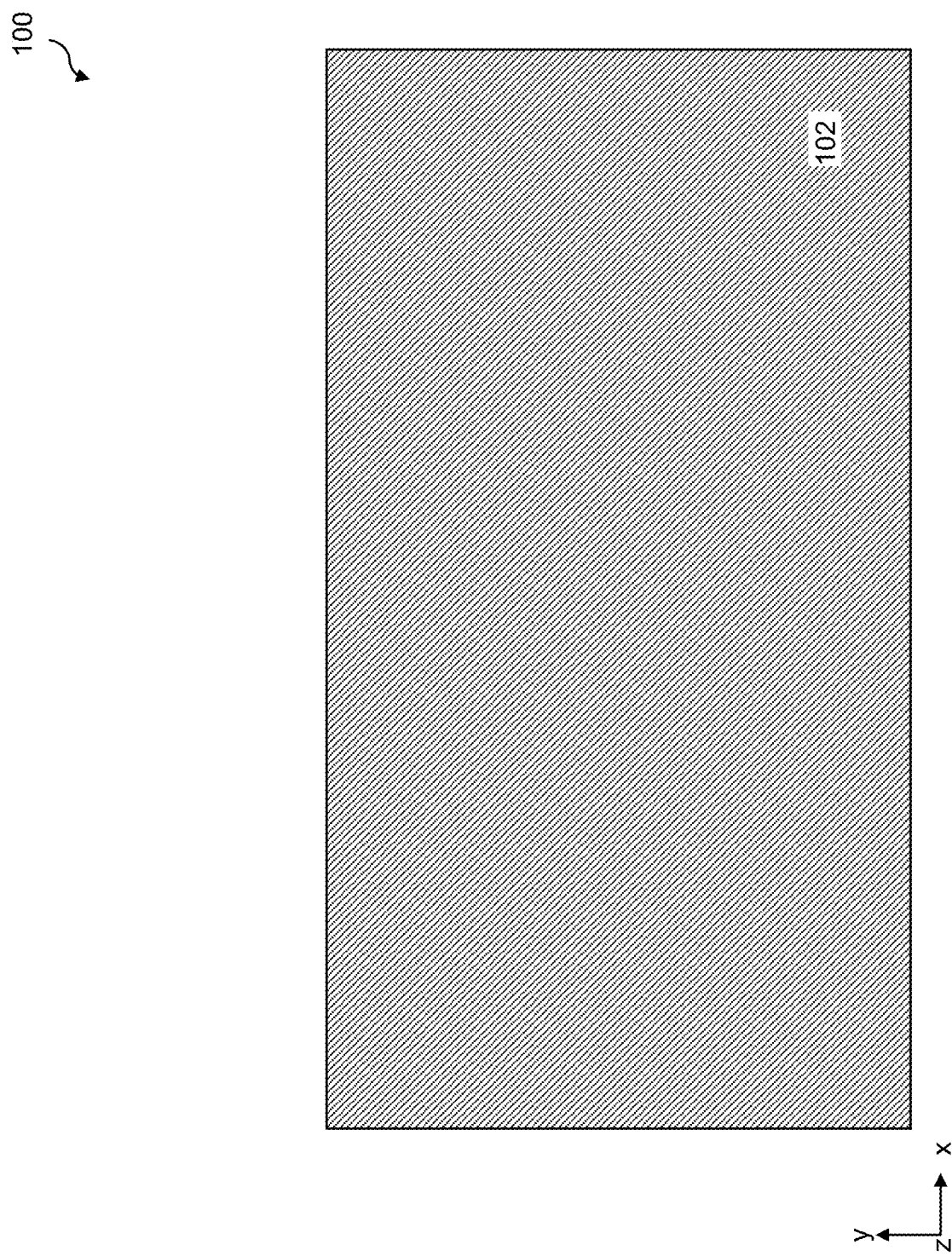
FIG. 1A is a vertical cross-sectional view of the exemplary structure after deposition of a base dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In overview, various embodiments directed to semiconductor devices are disclosed. Specifically, embodiments directed to radio-frequency (RF) resonator semiconductor structures including two or more resonator trenches and methods of forming the same. Various embodiment structures and methods may be used to reduce or eliminate adverse impacts of long manufacturing times. The various embodiment structures and methods may also be used to reduce and/or eliminate corrosion that occurs during these long etching processes, the various aspects of which are described herebelow.

Etching processes may be simultaneously time-sensitive and time-consuming. In particular, in semiconductor dies that include a large array of devices such as RF resonators and resonating circuits for detecting, measuring, and/or emitting RF signals, the etching processes used to form such array of devices may be time-sensitive and time-consuming. Etching processes may be time sensitive such that the formation of all required RF-related semiconductor structures within a single die may require multiple deposition and etching steps, during which conductive metals may be exposed to remnant etching gases. Such long exposures to etchant gases may result in corrosion of layers and materials. Long manufacturing times may cause F-pad buildup, or buildup of trench etching remnant gases (e.g., fluorine). Remnant etching gases exposed to oxygen during the time-consuming etching processes may react to create moisture, which may create a metal surface crystal defect (i.e., corrosion). Moisture caused by remnant etching gases may also be trapped under additional deposited layers, causing further defects to the semiconductor die. Such defects may lead to reduction in resonator function, such as altering the resonant frequencies of a resonator or leaving the fabricated resonator inoperable altogether.

A semiconductor die is disclosed within the present disclosure to reduce and/or eliminate RF resonator defects such as corrosion caused by remnant etching gases. The disclosed embodiment semiconductor dies may also be improved by standardizing and reducing manufacturing times. A semiconductor die may include a graduated, "step-like" structure including two or more resonator trenches having various depths within a dielectric layer, or substrate, in relation to a shared capping plate within the semiconductor die. The resonator trenches may be positioned within the semiconductor die such that the varying depths of each resonator trench in relation to the shared capping plate may create distinct resonator trenches (cavities) having different resonant frequencies. In addition, the embodiment methods may implement reduced steps to simultaneously layout each resonator trench. This reduction in the steps to fabricate the device may decrease manufacturing times. By reducing the manufacturing times and more specifically, the amount of time the device may be exposed to etchant gases, a reduction in the total amount of corrosion experienced during the manufacturing process may be achieved.

Various embodiment semiconductor dies and manufacturing methods are disclosed that may create semiconductor devices with multiple resonator trenches having different resonant frequencies. Such embodiment devices may be used in a variety of application and system requirements, such as RF applications. The graduated semiconductor die may allow the for customization of resonant frequencies specific to resonator trenches by varying the depths of the resonator trenches embedded within the substrate dielectric, adjusting the thicknesses of the capping plate and a dielectric layer between the capping plate and the resonator trenches, and by controlling the dielectric constants of the dielectric material layer(s) within each resonator trench (i.e., dielectric constants among the at least two resonator trenches is the same or different), among other structural design factors. Additionally, by embedding the resonator trenches within the substrate dielectric material there may be a reduction of the risk that the resonator structure may experience physical damage during the manufacturing process and during field operation. Consequently, the risk of RF degradation and/or a resulting inoperable semiconductor die structure may be reduced.

FIG. 1A is a vertical cross-sectional view of the exemplary structure 100 after deposition of a base dielectric layer 102 according to an embodiment of the present disclosure. Referring to FIG. 1A, the base dielectric layer 102 may be deposited within a semiconductor structure (not shown). The base dielectric layer 102 may include silicon oxide-based dielectric materials such as undoped silicate glass, doped silicate glass, or organosilicate glass. In one embodiment, the base dielectric layer 102 may include undoped silicon glass, silicon nitride, phosphosilicate glass, fluorosilicate glass, low-k material, extreme low-k material, and black diamond, and/or a layer stack thereof. Other suitable dielectric materials are within the contemplated scope of disclosure.

Figure 1B:
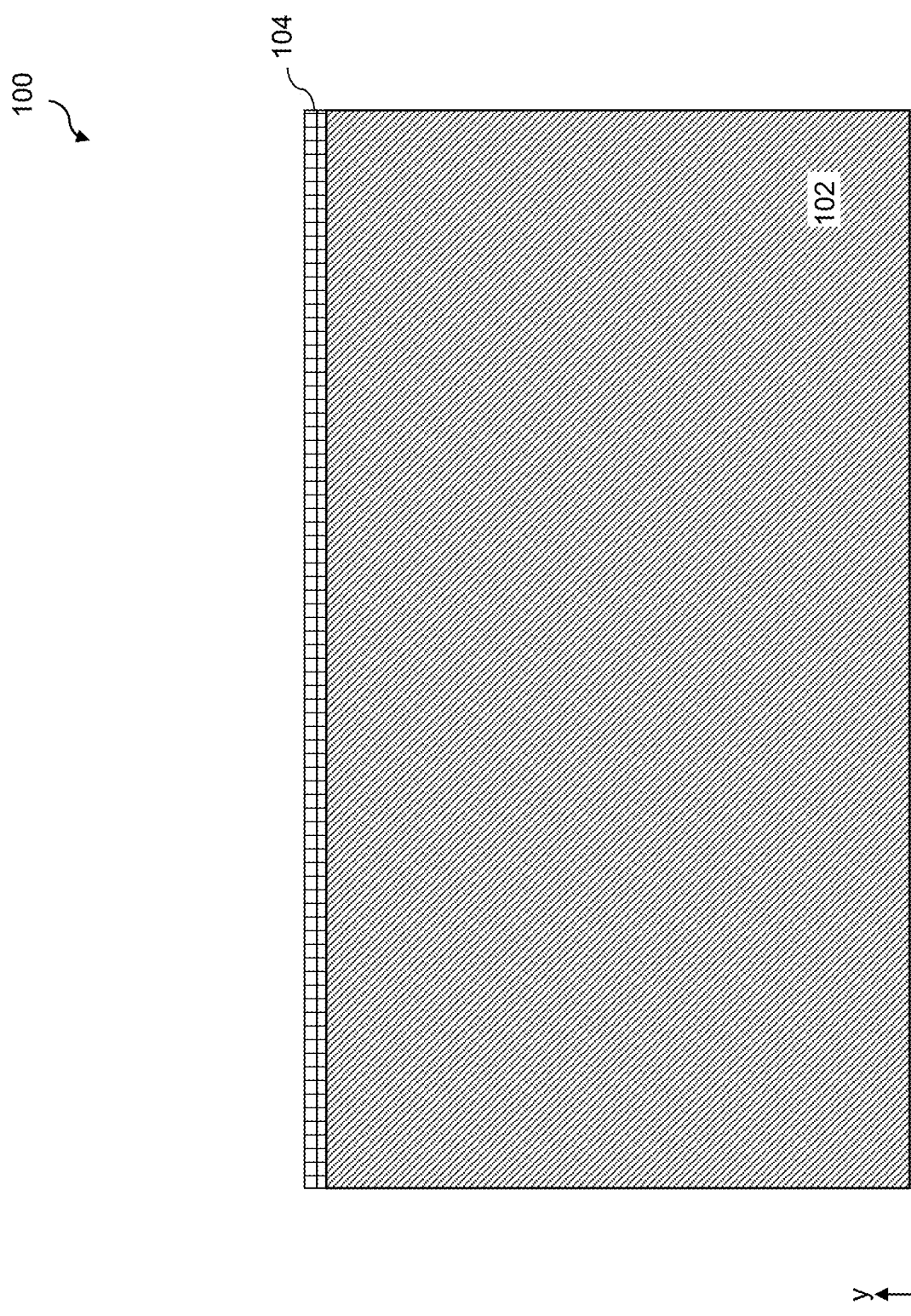
FIG. 1B is a vertical cross-sectional view of the exemplary structure after deposition of a first mask layer according to an embodiment of the present disclosure.

FIG. 1B is a vertical cross-sectional view of the exemplary structure 100 after deposition of a first mask layer 104 according to an embodiment of the present disclosure. Referring to FIG. 1B, the first mask layer 104 may be deposited over the base dielectric layer 102. The first mask layer 104 may include a metallic material that may function as an etch mask in subsequent anisotropic etch processes. For example, the first mask layer 104 may include a conductive metallic nitride material, such as titanium nitride (TiN), tantalum nitride (TaN), tungsten (W), or tungsten nitride (WN), or a conductive metallic carbide material, such as titanium carbide (TiC), tantalum carbide (TaC), or tungsten carbide (WC). Other suitable mask materials are within the contemplated scope of disclosure. The first mask layer 104 may be formed by chemical vapor deposition, atomic layer deposition, physical vapor deposition, or the like. The first mask layer 104 may have a thickness suitable for use in etching deep vias.

Figure 1C:
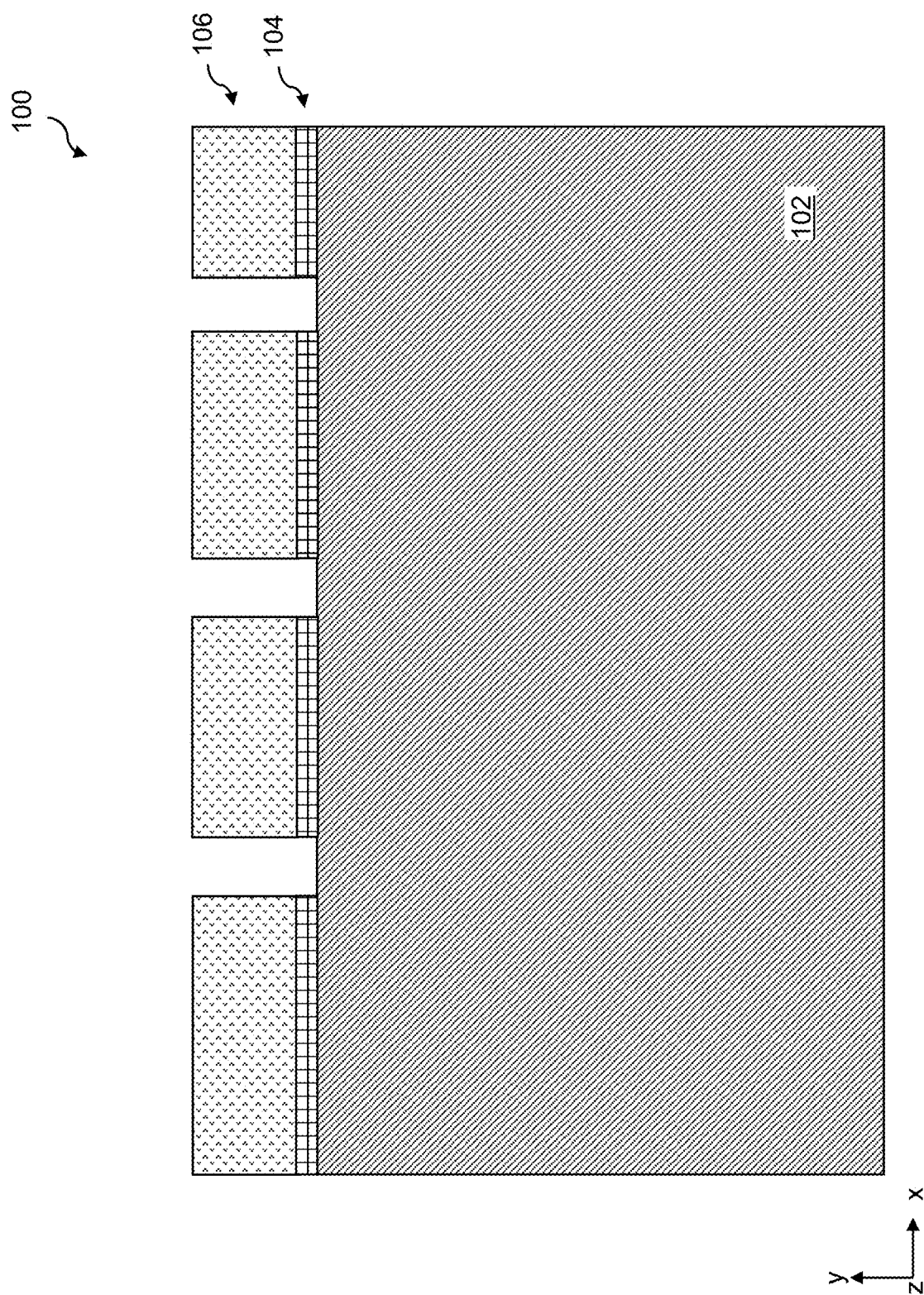
FIG. 1C is a vertical cross-sectional view of the exemplary structure after deposition and patterning of a first photoresist layer according to an embodiment of the present disclosure.

FIG. 1C is a vertical cross-sectional view of the exemplary structure 100 after the deposition and patterning of a first photoresist layer 106 according to an embodiment of the present disclosure. Referring to FIG. 1C, the first photoresist layer 106 may be applied over the first mask layer 104, and may be lithographically patterned to form an array of openings in areas that overlie the base dielectric layer 102. The area of each opening in the first photoresist layer 106 may be greater than, less than, or the same as, a desired area of the top of vias that are to be formed in subsequent processes.

An etch process may be performed to transfer the pattern in the first photoresist layer 106 through the first mask layer 104. The etch process may include an anisotropic etch process or an isotropic etch process. In one embodiment, an anisotropic etch process such as a reactive ion etch process may be performed to transfer the pattern in the first photoresist layer 106 through the first mask layer 104. The first photoresist layer 106 may be subsequently removed, for example, by ashing.

Figure 1D:
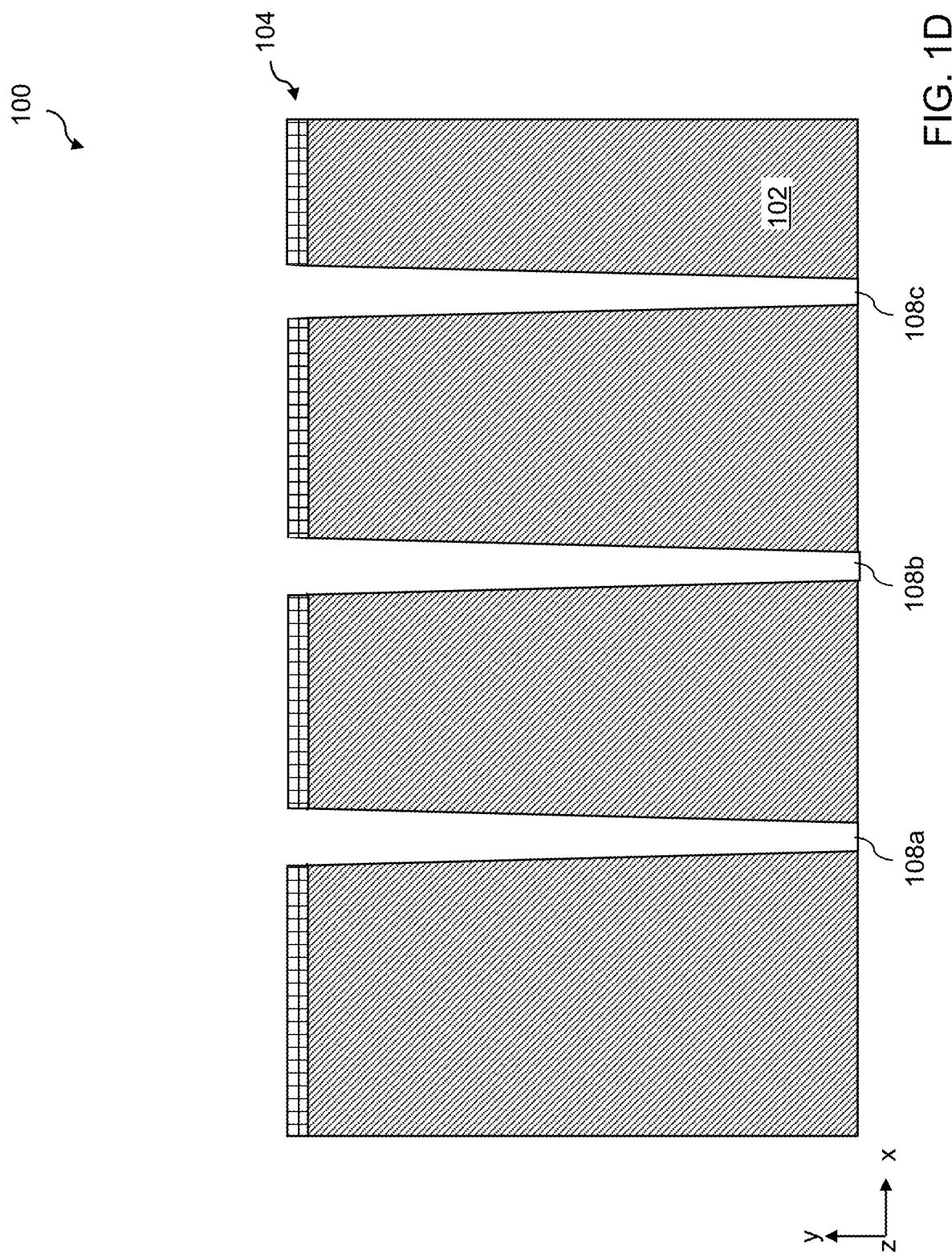
FIG. 1D is a vertical cross-sectional view of the exemplary structure after formation of an array of via cavities according to an embodiment of the present disclosure.

FIG. 1D is a vertical cross-sectional view of the exemplary structure 100 after formation of an array of via cavities 108a, 108b, 108c according to an embodiment of the present disclosure. Referring to FIG. 1D, an anisotropic etch process may be performed using the first mask layer 104 as an etch mask. The anisotropic etch process may comprise a reactive ion etch process that etches the base dielectric layer 102 selective to the materials of the first mask layer 104. In one embodiment, the base dielectric layer 102 may include one or more dielectric materials such as undoped silicon glass, doped silicate glass, organosilicate glass, silicon nitride, phosphosilicate glass, fluorosilicate glass, low-k material, extreme low-k material, black diamond, and/or a layer stack thereof, and the anisotropic etch process may include a reactive ion etch process that etches the base dielectric layer 102 dielectric material(s) selective to the dielectric materials of the first mask layer 104. The etch process may form deep via cavities 108a, 108b, 108c underneath the openings through the first mask layer 104.

Figure 1E:
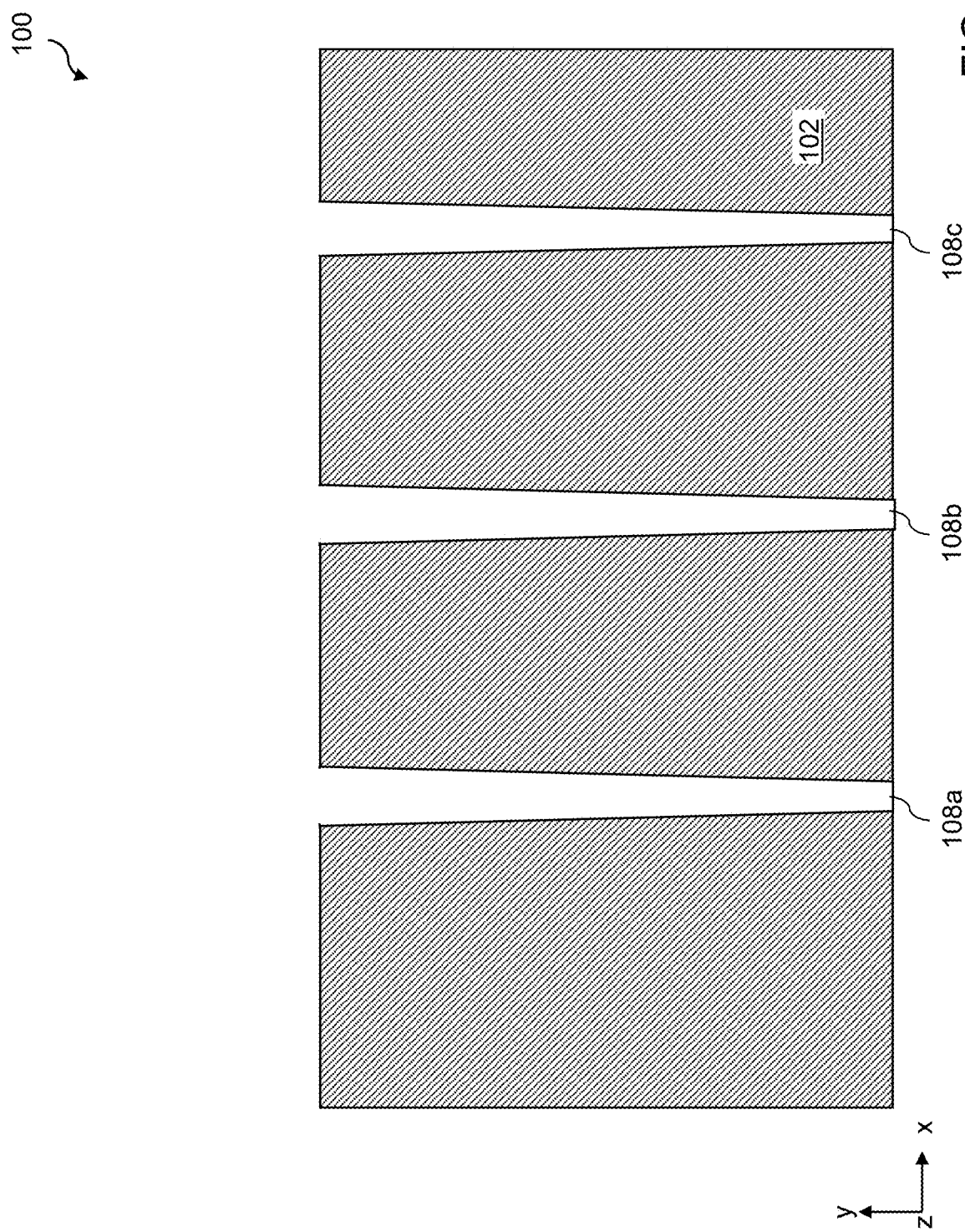
FIG. 1E is a vertical cross-sectional view of the exemplary structure after removing the first mask layer 104 according to an embodiment of the present disclosure.

FIG. 1E is a vertical cross-sectional view of the exemplary structure after removing the first mask layer 104 according to an embodiment of the present disclosure. An anisotropic etch process may be performed to remove portions of the first mask layer 104 that may remain after performing the etch process as described with reference to FIG. 1D. Referring to FIG. 1E, the chemistry of the anisotropic etch process may be selective to the materials of the base dielectric layer 102. For example, the first mask layer 104 may include materials TiN, TaN, W, WN, TiC, TaC, or WC, and the anisotropic etch process may include a reactive ion etch process that etches the first mask layer 104 selective to the dielectric materials of the base dielectric layer 102. In an illustrative example, the anisotropic etch process may include a reactive ion etch process using HBr, $CH_2H_2$, $CHF_3$, $CF_4$, $O_2$, $N_2$, $CH_xF_y$, Ar, He, $Cl_2$ and/or other fluorinated gas(es) or halogen gas(es) as process gases.

FIG. 1F is a vertical cross-sectional view of the exemplary structure 100 after deposition of a metallic fill material layer in the via cavities 108a, 108b, 108c according to an embodiment of the present disclosure. Referring to FIG. 1F, a metallic fill material layer may be sequentially deposited in, and over, each of the via cavities 108a, 108b, 108c to form metallic fill material portions. A metallic fill material layer (not shown) may include a metallic material that provides high electrical conductivity. For example, the metallic fill material layer may include an elemental metal or an intermetallic alloy of at least two elemental metals. In one embodiment, the metallic fill material layer may include copper (Cu), W, ruthenium (Ru), molybdenum (Mo), aluminum (Al), aluminum copper (AlCu), aluminum silicon copper (AlSiCu), alloys thereof, and/or a layer stack thereof. Other suitable metallic fill materials within the contemplated scope of disclosure may also be used. The metallic fill material layer may be deposited by any physical vapor deposition, chemical vapor deposition, electroplating, or electroless plating.

A chemical mechanical polishing/planarization (CMP) process may be performed to remove portions of the metallic fill material layer that overlie a horizontal plane including the top surface of the base dielectric layer 102. Each remaining portion of the metallic fill material layer that fills a via cavity may form contact vias 110a, 110b, 110c. The top surfaces of the contact vias 110a, 110b, 110c may be within the same horizontal plane as the top surface of the base dielectric layer 102.

In some embodiments, the metallic fill material layer used to form the contact vias 110a, 110b, 110c may be deposited/disposed over a previously deposited via barrier layer (not shown). Each via barrier layer may be a patterned portion of the metallic barrier layer as deposited in a manner similar to the metallic fill material layer according to the processing steps of FIG. 1F. A via barrier layer may include an elemental metal or an intermetallic alloy of at least two elemental metals. In one embodiment, the via barrier layer may include Ti, Ta, TiN, TaN, W, alloys thereof, and/or a layer stack thereof. Other suitable barrier layer materials within the contemplated scope of disclosure may also be used. The via barrier layer may be deposited by any physical vapor deposition, chemical vapor deposition, electroplating, or electroless plating.

Generally, the contact vias 110a, 110b, 110c may be formed by depositing at least one conductive material in the via cavities 108a, 108b, 108c. Each of the contact vias 110a, 110b, 110c may be formed directly on a top surface of any respective semiconductor structure, such as a metal interconnect structure or a logic device structure or peripheral connection to a logic device structure used in logic devices, light emitting diode (LED) or liquid crystal display (LCD) devices, random access memory (RAM) devices, CMOS Image Sensor (CIS) devices, and any other device in which RF resonators may be used to implement said device.

In some embodiments, the contact vias 110a, 110b, 110c may be deep vias formed using techniques suitable for developing deep vias within a dielectric material. For example, the via cavities 108a, 108b, 108c and contact vias 110a, 110b, 110c may be formed piecewise, such that portions of the base dielectric layer 102 and portions of the contact vias 110a, 110b, 110c may be formed in a sequence. For example, a lower, or first portion of the base dielectric layer 102 may be formed, first portions of the via cavities 108a, 108b, 108c may be etched, and first portions of the contact vias 110a, 110b, 110c may be formed within the first portions of the via cavities 108a, 108b, 108c. A second portion of the base dielectric layer 102 may be deposited over the first portion of the base dielectric layer 102 and top surfaces of the lower portions of the contact vias 110a, 110b, 110c. Second portions of the via cavities 108a, 108b, 108c may be etched within the second portion of the base dielectric layer 102, and second portions of the contact vias 110a, 110b, 110c may be formed within the second portions of the via cavities 108a, 108b, 108c. Additional portions of the base dielectric layer 102 and contact vias 110a, 110b, 110c may be formed to achieve a desired depth of the contact vias 110a, 110b, 110c.

In one embodiment, portions of the via cavities 108a, 108b, 108c may be formed within portions of the base dielectric layer 102 as previously described, such that sidewalls of the various portions of the via cavities 108a, 108b, 108c may be tapered and in alignment with adjacent vertical portions of the via cavities 108a, 108b, 108c. Subsequently, the contact vias 110a, 110b, 110c may be formed in their entirety by depositing a metallic material layer within the finished via cavities 108a, 108b, 108c.

Figure 1G:
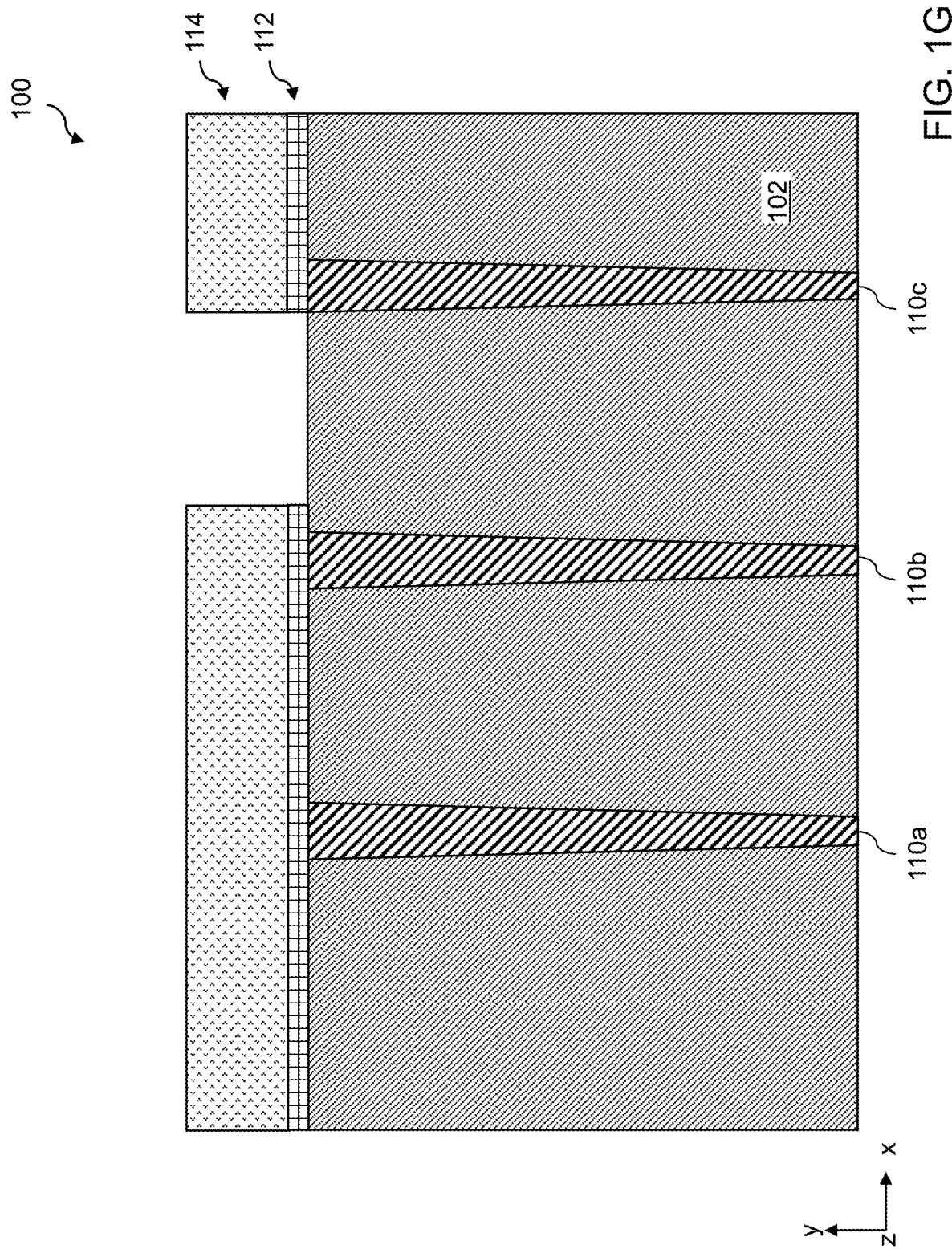
FIG. 1G is a vertical cross-sectional view of the exemplary structure after deposition of a second mask layer and a second photoresist layer according to an embodiment of the present disclosure.

FIG. 1G is a vertical cross-sectional view of the exemplary structure 100 after deposition of a second mask layer 112 and a second photoresist layer 114 according to an embodiment of the present disclosure. The second mask layer 112 and the second photoresist layer 114 may be deposited and patterned in a similar manner as the first mask layer 104 and the first photoresist layer 106 as described with reference to FIGS. 1B and 1C. Referring to FIG. 1G, the second mask layer 112 may be deposited over the base dielectric layer 102 and top surfaces of the contact vias 110a, 110b, 110c. The second mask layer 112 may include a metallic material that may function as an etch mask in subsequent anisotropic etch processes. For example, the second mask layer 112 may include a conductive metallic nitride material, such as TiN, TaN, W, or WN, or a conductive metallic carbide material, such as TiC, TaC, or WC. The second mask layer 112 may be formed by chemical vapor deposition, atomic layer deposition, physical vapor deposition, or the like. The second mask layer 112 may have a thickness range from 2 nm to 20 nm, such as from 3 nm to 10 nm, although lesser and greater thicknesses may also be used.

The second photoresist layer 114 may be applied over the second mask layer 112, and may be lithographically patterned to form an opening in areas that overlie a width of the base dielectric layer 102 between the contact vias 110b and 110c. The area of the opening in the second photoresist layer 114 may be greater than, less than, or the same as, a desired area of a cavity in which an RF resonator may be formed in subsequent processes.

An etch process may be performed to transfer the pattern in the second photoresist layer 114 through the second mask layer 112. The etch process may include an anisotropic etch process or an isotropic etch process. In one embodiment, an anisotropic etch process such as a reactive ion etch process may be performed to transfer the pattern in the second photoresist layer 114 through the second mask layer 112. The second photoresist layer 114 may be subsequently removed, for example, by ashing.

Figure 1H:
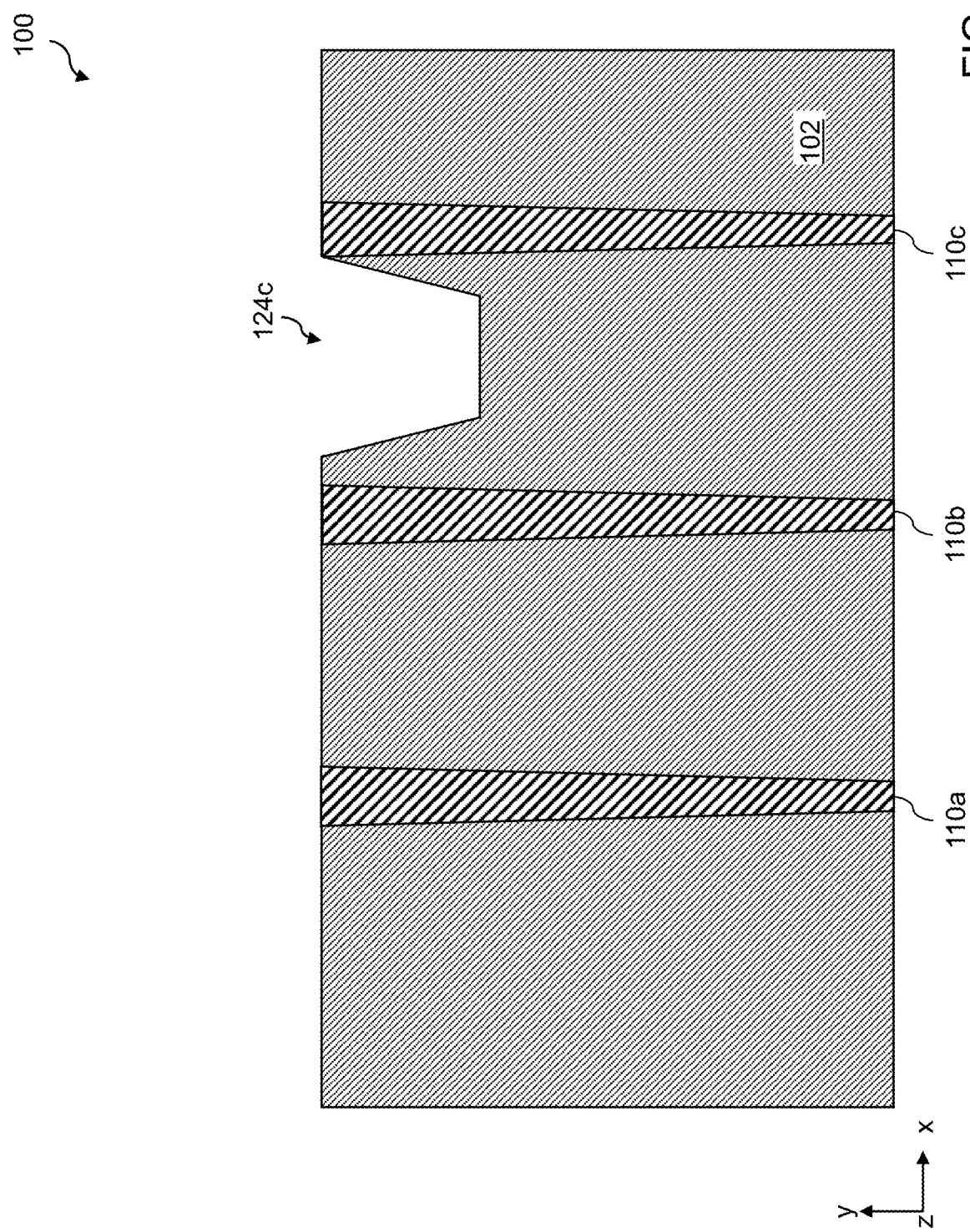
FIG. 1H is a vertical cross-sectional view of the exemplary structure after formation of a resonator cavity according to an embodiment of the present disclosure.

FIG. 1H is a vertical cross-sectional view of the exemplary structure 100 after formation of a resonator trench (cavity) 124c according to an embodiment of the present disclosure. Referring to FIG. 1H, an anisotropic etch process may be performed using the second mask layer 112 as an etch mask. The anisotropic etch process may comprise a reactive ion etch process that etches the base dielectric layer 102 selective to the materials of the second mask layer 112. In one embodiment, the base dielectric layer 102 may include one or more dielectric materials such as undoped silicon glass, doped silicate glass, organosilicate glass, silicon nitride, phosphosilicate glass, fluorosilicate glass, low-k material, extreme low-k material, black diamond, and/or a layer stack thereof, and the anisotropic etch process may include a reactive ion etch process that etches the base dielectric layer 102 dielectric material(s) selective to the dielectric materials of the second mask layer 112. The etch process may form the resonator cavity 124c underneath the openings through the second mask layer 112.

An anisotropic etch process may be performed to remove portions of the second mask layer 112 that may remain after etching the base dielectric layer 102 to form the resonator cavity 124c. The chemistry of the anisotropic etch process may be selective to the materials of the base dielectric layer 102 and the contact vias 110a, 110b, 110c. For example, the second mask layer 112 may include materials TiN, TaN, W, WN, TiC, TaC, or WC, and the anisotropic etch process may include a reactive ion etch process that etches the second mask layer 112 selective to the dielectric materials of the base dielectric layer 102 and the contact vias 110a, 110b, 110c. In an illustrative example, the anisotropic etch process may include a reactive ion etch process using HBr, $CH_2H_2$, $CHF_3$, $CF_4$, $O_2$, $N_2$, $CH_xF_y$, Ar, He, $Cl_2$ and/or other fluorinated gas(es) or halogen gas(es) as process gases.

Figure 1I:
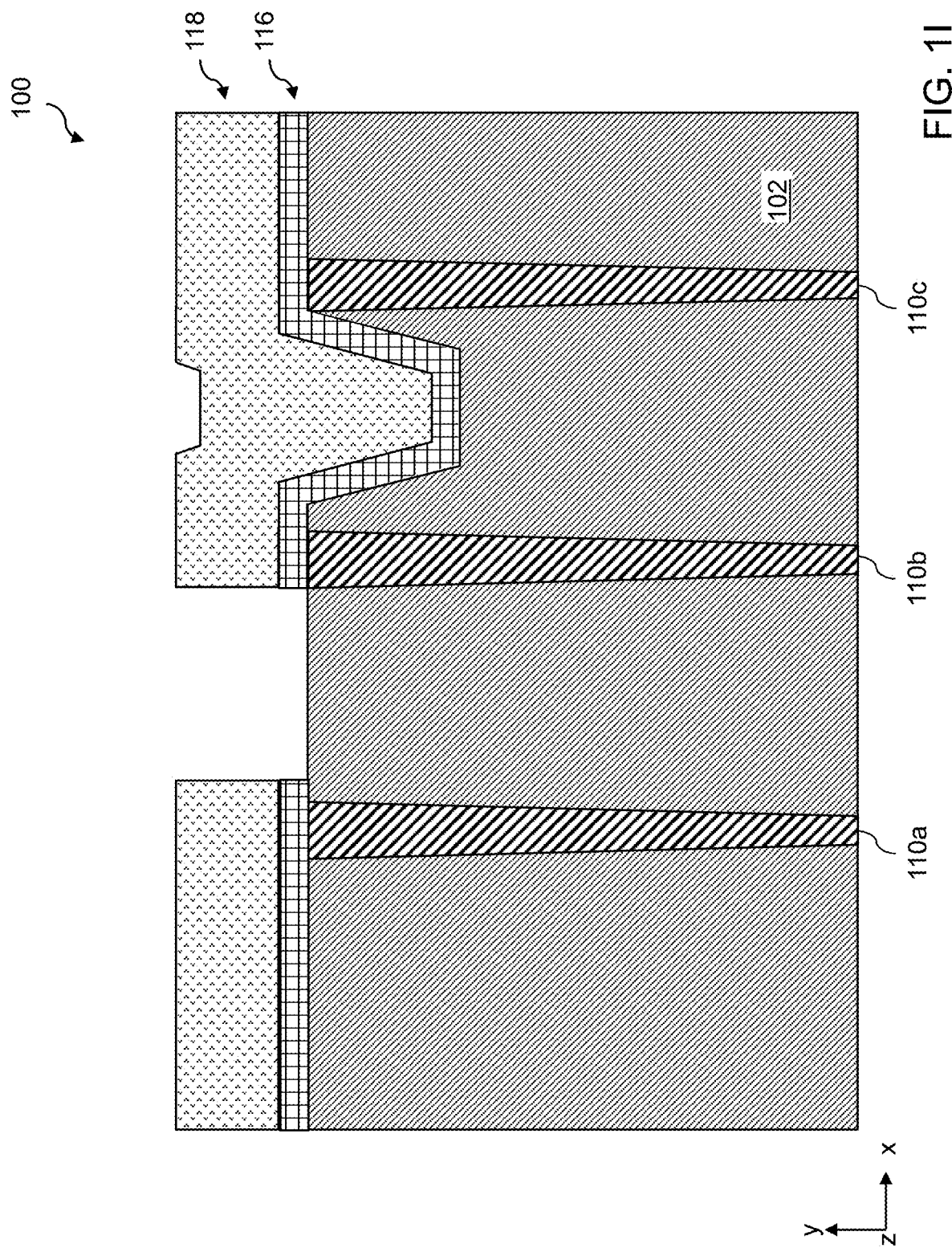
FIG. 1I is a vertical cross-sectional view of the exemplary structure after deposition of a third mask layer and a third photoresist layer according to an embodiment of the present disclosure

FIG. 1I is a vertical cross-sectional view of the exemplary structure 100 after deposition of a third mask layer 116 and a third photoresist layer 118 according to an embodiment of the present disclosure. The third mask layer 116 and the third photoresist layer 118 may be deposited and patterned in a similar manner as the first mask layer 104 and the first photoresist layer 106 as described with reference to FIGS. 1B and 1C. Referring to FIG. 1I, the third mask layer 116 may be deposited over the base dielectric layer 102, including top surfaces of the base dielectric layer 102 inside the resonator cavity 124c, and top surfaces of the contact vias 110a, 110b, 110c. The third mask layer 116 may include a metallic material that may function as an etch mask in subsequent anisotropic etch processes. For example, the third mask layer 116 may include a conductive metallic nitride material, such as TiN, TaN, W, or WN, or a conductive metallic carbide material, such as TiC, TaC, or WC. The third mask layer 116 may be formed by chemical vapor deposition, atomic layer deposition, physical vapor deposition, or the like. The third mask layer 116 may have a thickness range from 2 nm to 20 nm, such as from 3 nm to 10 nm, although lesser and greater thicknesses may also be used.

The third photoresist layer 118 may be applied over the third mask layer 116, and may be lithographically patterned to form an opening in areas that overlie a width of the base dielectric layer 102 between the contact vias 110a and 110b. The area of the opening in the third photoresist layer 118 may be greater than, less than, or the same as, a desired area of a cavity in which an RF resonator may be formed in subsequent processes.

An etch process may be performed to transfer the pattern in the third photoresist layer 118 through the third mask layer 116. The etch process may include an anisotropic etch process or an isotropic etch process. In one embodiment, an anisotropic etch process such as a reactive ion etch process may be performed to transfer the pattern in the third photoresist layer 118 through the third mask layer 116. The third photoresist layer 118 may be subsequently removed, for example, by ashing.

FIG. 1J is a vertical cross-sectional view of the exemplary structure 100 after formation of a resonator cavity 124b according to an embodiment of the present disclosure. Referring to FIG. 1J, an anisotropic etch process may be performed using the third mask layer 116 as an etch mask. The anisotropic etch process may comprise a reactive ion etch process that etches the base dielectric layer 102 selective to the materials of the third mask layer 116. In one embodiment, the base dielectric layer 102 may include one or more dielectric materials such as undoped silicon glass, doped silicate glass, organosilicate glass, silicon nitride, phosphosilicate glass, fluorosilicate glass, low-k material, extreme low-k material, black diamond, and/or a layer stack thereof, and the anisotropic etch process may include a reactive ion etch process that etches the base dielectric layer 102 dielectric material(s) selective to the dielectric materials of the third mask layer 116. The etch process may form the resonator cavity 124b underneath the openings through the third mask layer 116.

An anisotropic etch process may be performed to remove portions of the third mask layer 116 that may remain after etching the base dielectric layer 102 to form the resonator cavity 124b. The chemistry of the anisotropic etch process may be selective to the materials of the base dielectric layer 102 and the contact vias 110a, 110b, 110c. For example, the third mask layer 116 may include materials TiN, TaN, W, WN, TiC, TaC, or WC, and the anisotropic etch process may include a reactive ion etch process that etches the third mask layer 116 selective to the dielectric materials of the base dielectric layer 102 and the contact vias 110a, 110b, 110c. In an illustrative example, the anisotropic etch process may include a reactive ion etch process using HBr, $CH_2H_2$, $CHF_3$, $CF_4$, $O_2$, $N_2$, $CH_xF_y$, Ar, He, $Cl_2$ and/or other fluorinated gas(es) or halogen gas(es) as process gases.

Figure 1K:
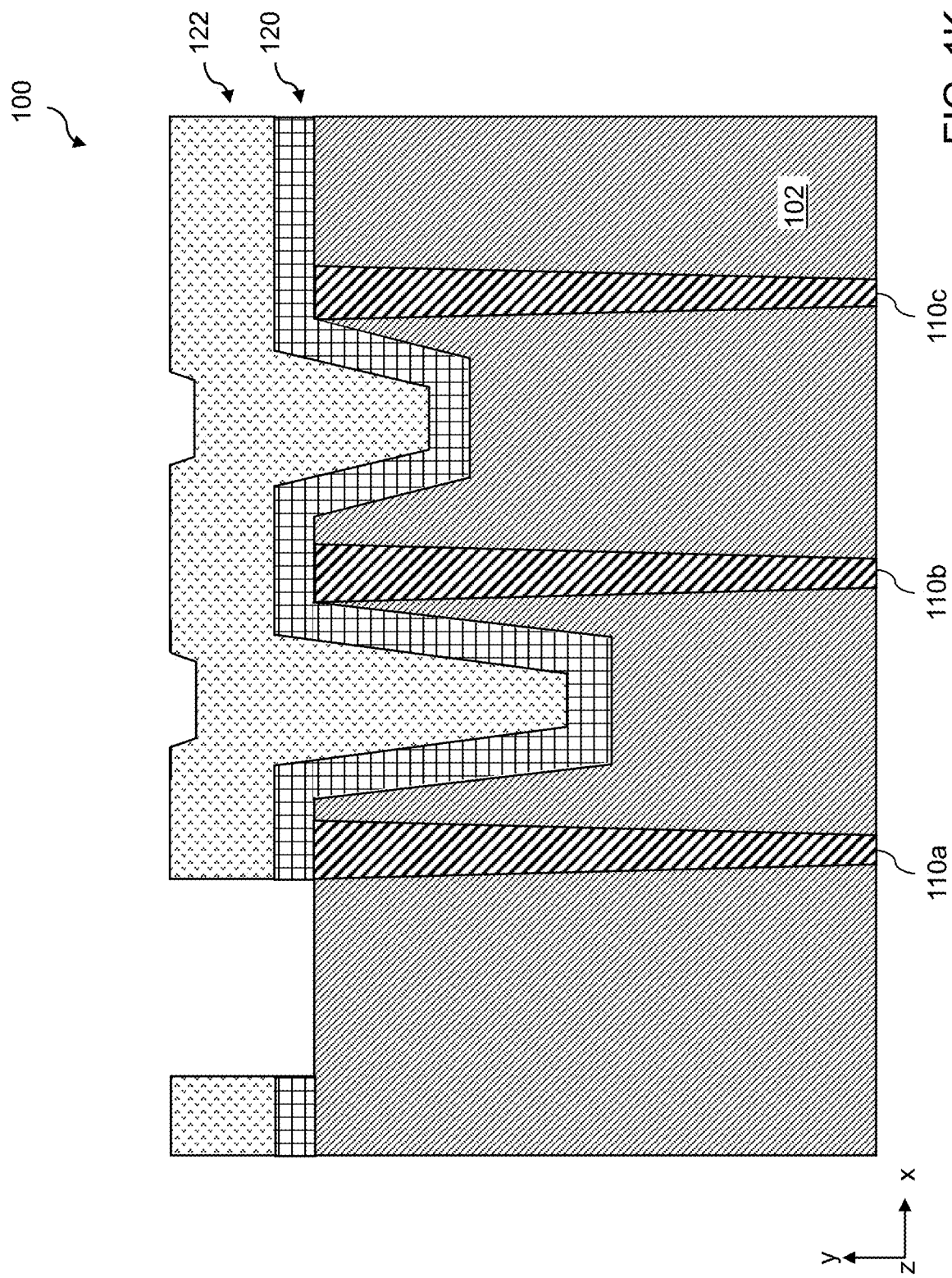
FIG. 1K is a vertical cross-sectional view of the exemplary structure after deposition of a fourth mask layer and a fourth photoresist layer according to an embodiment of the present disclosure.

FIG. 1K is a vertical cross-sectional view of the exemplary structure 100 after deposition of a fourth mask layer 120 and a fourth photoresist layer 122 according to an embodiment of the present disclosure. The fourth mask layer 120 and the fourth photoresist layer 122 may be deposited and patterned in a similar manner as the first mask layer 104 and the first photoresist layer 106 as described with reference to FIGS. 1B and 1C. Referring to FIG. 1K, the fourth mask layer 120 may be deposited over the base dielectric layer 102, including top surfaces of the base dielectric layer 102 inside the resonator cavity 124b and resonator cavity 124c, and top surfaces of the contact vias 110a, 110b, 110c. The fourth mask layer 120 may include a metallic material that may function as an etch mask in subsequent anisotropic etch processes. For example, the fourth mask layer 120 may include a conductive metallic nitride material, such as TiN, TaN, W, or WN, or a conductive metallic carbide material, such as TiC, TaC, or WC. The fourth mask layer 120 may be formed by chemical vapor deposition, atomic layer deposition, physical vapor deposition, or the like. The fourth mask layer 120 may have a thickness range from 2 nm to 20 nm, such as from 3 nm to 10 nm, although lesser and greater thicknesses may also be used.

The fourth photoresist layer 122 may be applied over the fourth mask layer 120, and may be lithographically patterned to form an opening in areas that overlie a width of the base dielectric layer 102 adjacent to the contact via 110a (e.g., to the left of the contact via 110a as illustrated). The area of the opening in the fourth photoresist layer 122 may be greater than, less than, or the same as, a desired area of a cavity in which an RF resonator may be formed in subsequent processes.

An etch process may be performed to transfer the pattern in the fourth photoresist layer 122 through the fourth mask layer 120. The etch process may include an anisotropic etch process or an isotropic etch process. In one embodiment, an anisotropic etch process such as a reactive ion etch process may be performed to transfer the pattern in the fourth photoresist layer 122 through the fourth mask layer 120. The fourth photoresist layer 122 may be subsequently removed, for example, by ashing.

Figure 1L:
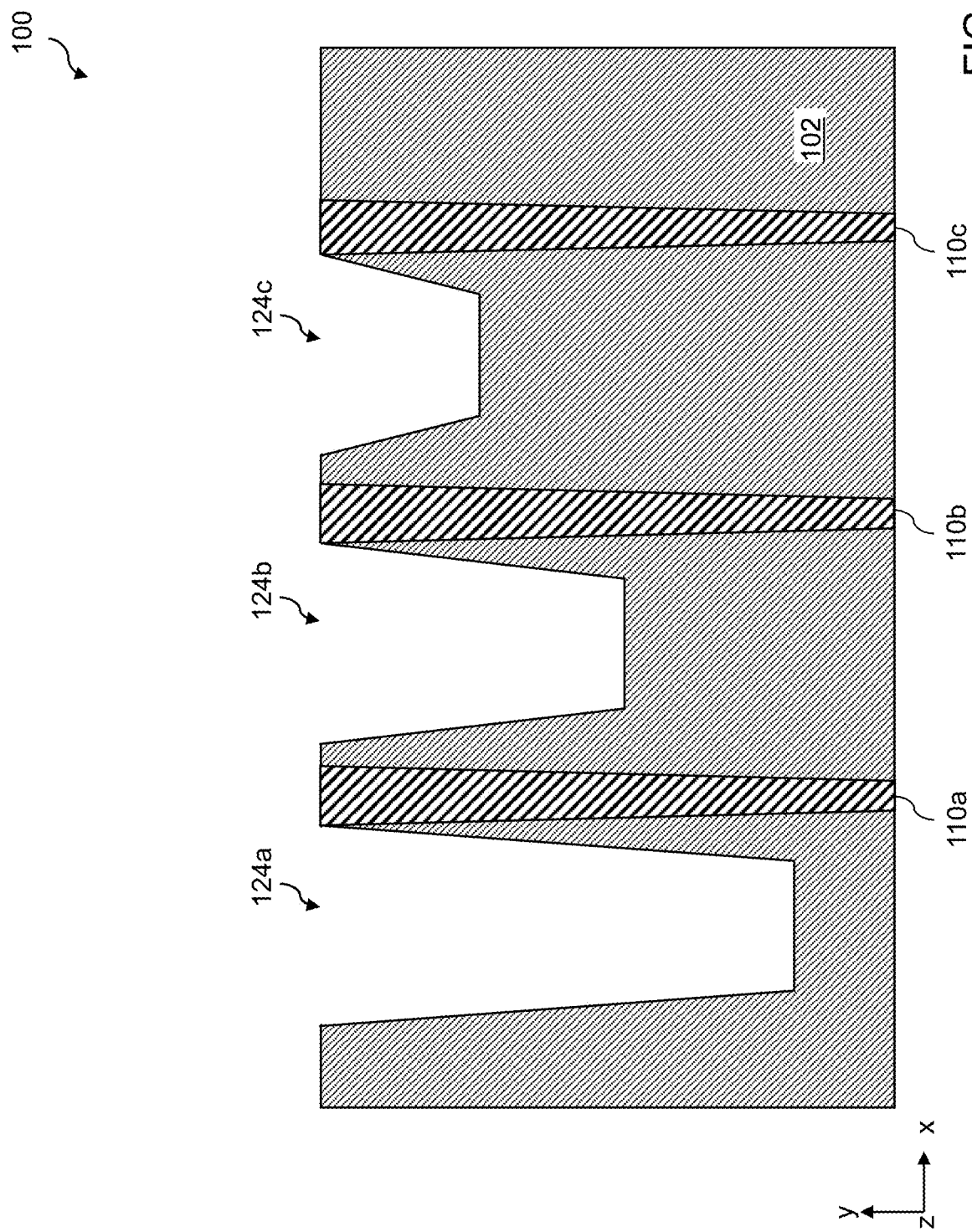
FIG. 1L is a vertical cross-sectional view of the exemplary structure after formation of a resonator cavity according to an embodiment of the present disclosure.

FIG. 1L is a vertical cross-sectional view of the exemplary structure 100 after formation of a resonator cavity 124a according to an embodiment of the present disclosure. Referring to FIG. 1L, an anisotropic etch process may be performed using the fourth mask layer 120 as an etch mask. The anisotropic etch process may comprise a reactive ion etch process that etches the base dielectric layer 102 selective to the materials of the fourth mask layer 120. In one embodiment, the base dielectric layer 102 may include one or more dielectric materials such as undoped silicon glass, doped silicate glass, organosilicate glass, silicon nitride, phosphosilicate glass, fluorosilicate glass, low-k material, extreme low-k material, black diamond, and/or a layer stack thereof, and the anisotropic etch process may include a reactive ion etch process that etches the base dielectric layer 102 dielectric material(s) selective to the dielectric materials of the fourth mask layer 120. The etch process may form the resonator cavity 124a underneath the openings through the fourth mask layer 120.

An anisotropic etch process may be performed to remove portions of the fourth mask layer 120 that may remain after etching the base dielectric layer 102 to form the resonator cavity 124a. The chemistry of the anisotropic etch process may be selective to the materials of the base dielectric layer 102 and the contact vias 110a, 110b, 110c. For example, the fourth mask layer 120 may include materials TiN, TaN, W, WN, TiC, TaC, or WC, and the anisotropic etch process may include a reactive ion etch process that etches the fourth mask layer 120 selective to the dielectric materials of the base dielectric layer 102 and the contact vias 110a, 110b, 110c. In an illustrative example, the anisotropic etch process may include a reactive ion etch process using HBr, $CH_2H_2$, $CHF_3$, $CF_4$, $O_2$, $N_2$, $CH_xF_y$, Ar, He, $Cl_2$ and/or other fluorinated gas(es) or halogen gas(es) as process gases.

The etching processes used to form the resonator cavities 124a, 124b, 124c, also referred to as resonator shallow trenches, as described with reference to FIGS. 1G-1L are performed in order from right to left, forming the resonator cavity 124c first, followed by the resonator cavity 124b, and subsequently the resonator cavity 124a. The order of etching of the resonator cavities 124a, 124b, 124c as described is merely illustrative and each of the resonator cavities 124a, 124b, 124c may be etched in any order with respect to other resonator cavities 124a, 124b, 124c. For example, the resonator cavity 124a may be etched first, followed by the resonator cavity 124b and then the resonator cavity 124c. As another example, the resonator cavity 124b may be etched first, then resonator cavity 124a may be etched followed by the resonator cavity 124c.

In some embodiments, alternatively to the processes as described with reference to FIGS. 1G-1L, one or more etch processes may be performed to shape the base dielectric layer 102 having resonator cavities 124a, 124b, 124c. For example, the resonator cavities 124a, 124b, 124c may be formed in a single etch process, such as through ion-beam etching. The etch process(es) may form the graduated, step-like, shape of the base dielectric layer 102 as shown using any various deposition and etching techniques. The etch(es) process may be performed to create a graduated trench shape, in which varying depths of the resonator cavities 124a, 124b, 124c may be formed adjacent to and in between contact vias 110a, 110b, 110c. The horizontal planes within the trench shape may be formed at heights less than the height of the top surface of the sidewalls.

For ease of illustration, three graduated "steps" are shown as three depths of the resonator cavities 124a, 124b, 124c. However, the structure 100 may include only two resonator cavities of varying depths, or may include any number of resonator cavities greater than two in which each resonator cavity is adjacent to at least one corresponding contact via within the base dielectric layer 102. In some embodiments, the structure 100 may include multiple resonator cavities, in which each resonator cavity of the multiple resonator cavities is a depth that is a different depth from at least one other resonator cavity. For example, the resonator cavity 124b may be of a certain depth, and the resonator cavities 124a, 124c may have a same depth that is different than the depth of the resonator cavity 124b. As another example, the structure 100 may include ten resonator cavities, with each resonator cavity having a depth alternating between a first depth and a different second depth. As a further example, the structure 100 may include five resonator cavities each having a different unique depth, similar to what is illustrated in FIG. 1L.

Figure 1M:
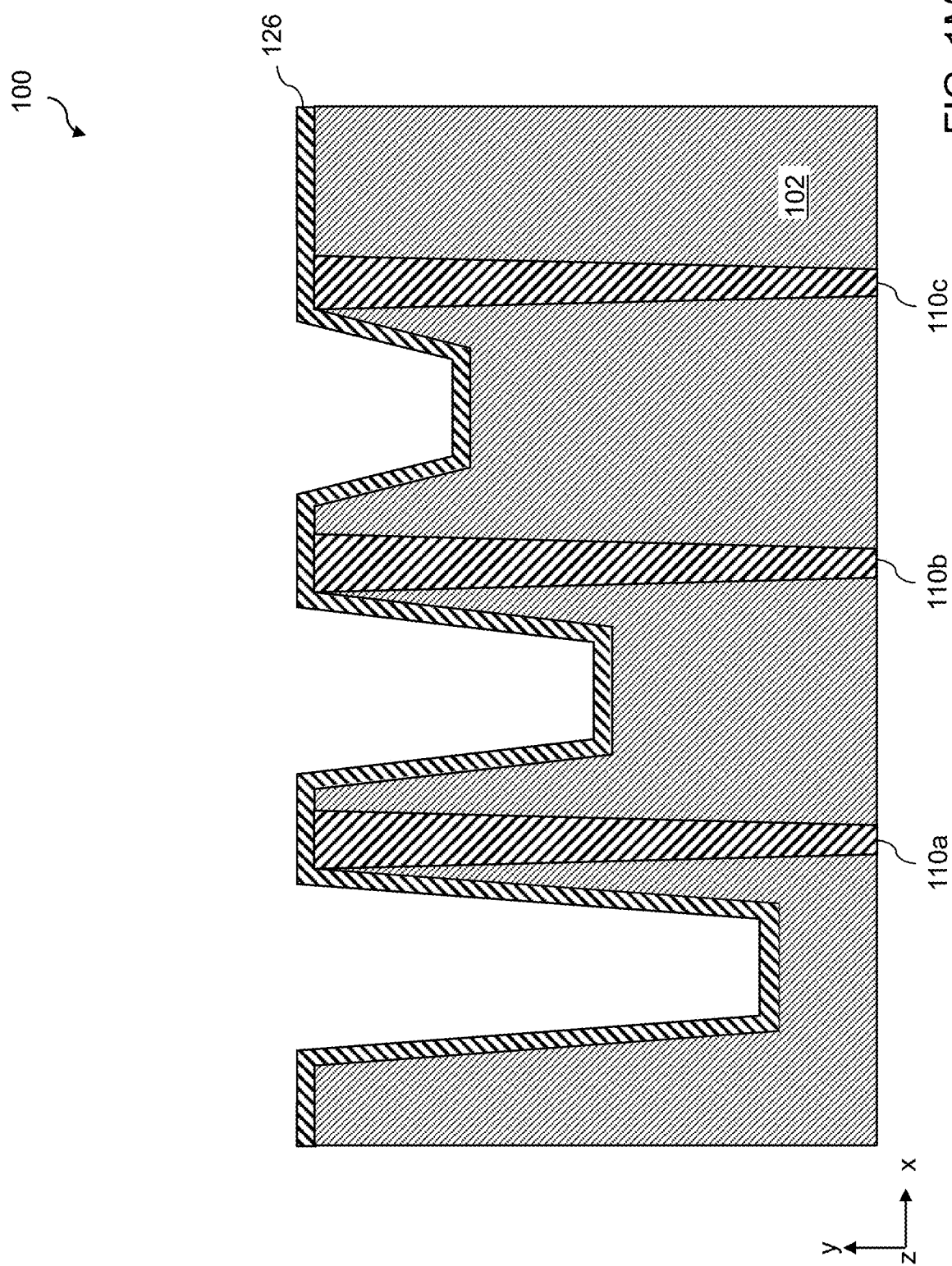
FIG. 1M is a vertical cross-sectional view of a region of the exemplary structure after deposition of a metallic barrier layer according to an embodiment of the present disclosure

FIG. 1M is a vertical cross-sectional view of a region of the exemplary structure 100 after deposition of a metallic barrier layer 126 according to an embodiment of the present disclosure. Referring to FIG. 1M, the metallic barrier layer 126 may be sequentially deposited over each top surface of the contact vias 110a, 110b, 110c and the exposed top surfaces of the base dielectric layer 102. The metallic barrier layer 126 may include an elemental metal or an intermetallic alloy of at least two elemental metals. In one embodiment, the metallic barrier layer 126 may include Ti, Ta, TiN, TaN, W, alloys thereof, and/or a layer stack thereof. Other suitable metallic barrier layer materials may be within the contemplated scope of disclosure. The metallic barrier layer 126 may be deposited by any physical vapor deposition, chemical vapor deposition, electroplating, or electroless plating.

Figure 1N:
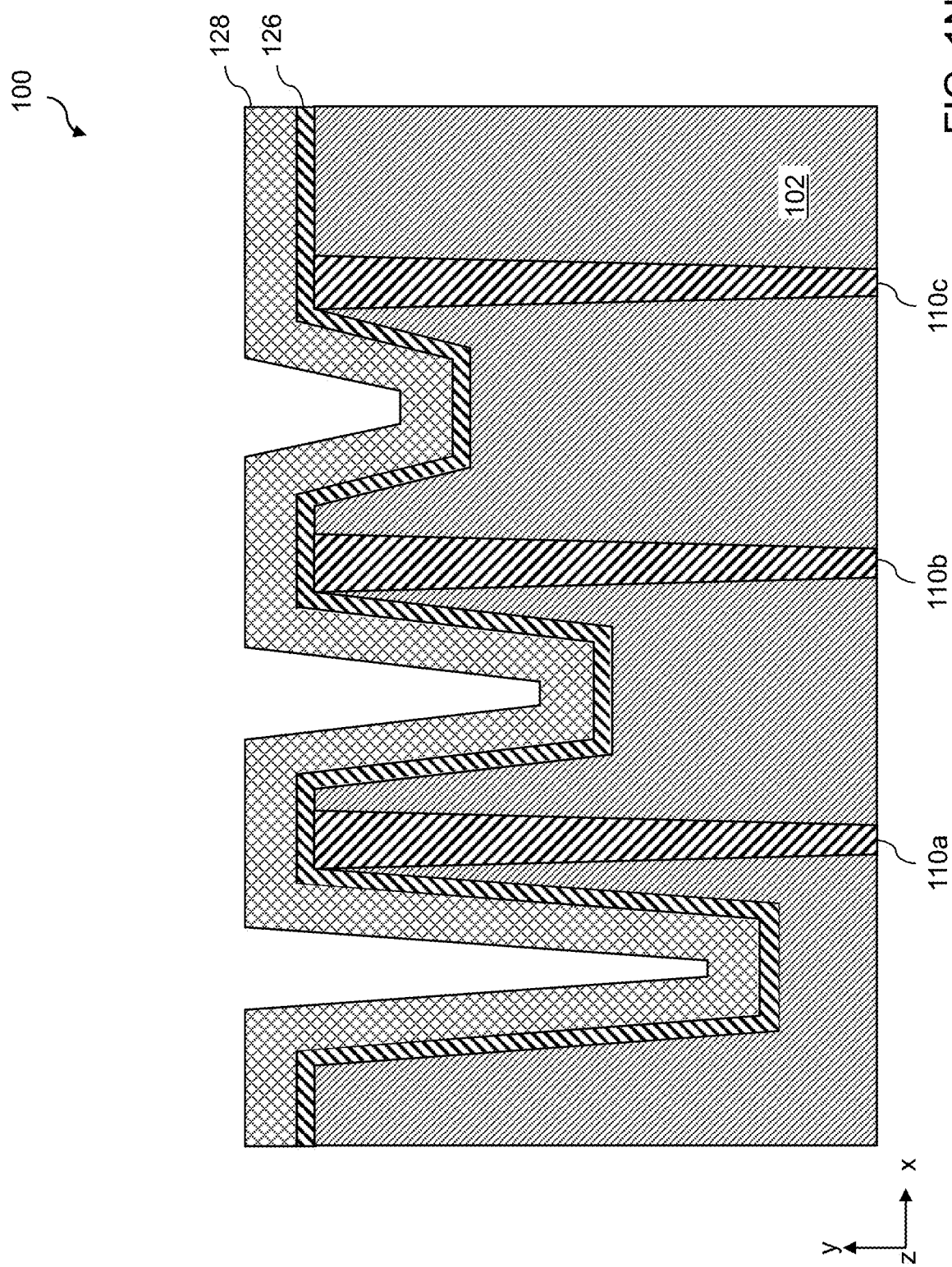
FIG. 1N is a vertical cross-sectional view of a region of the exemplary structure after deposition of a metallic resonance layer according to an embodiment of the present disclosure.
Figure 10:
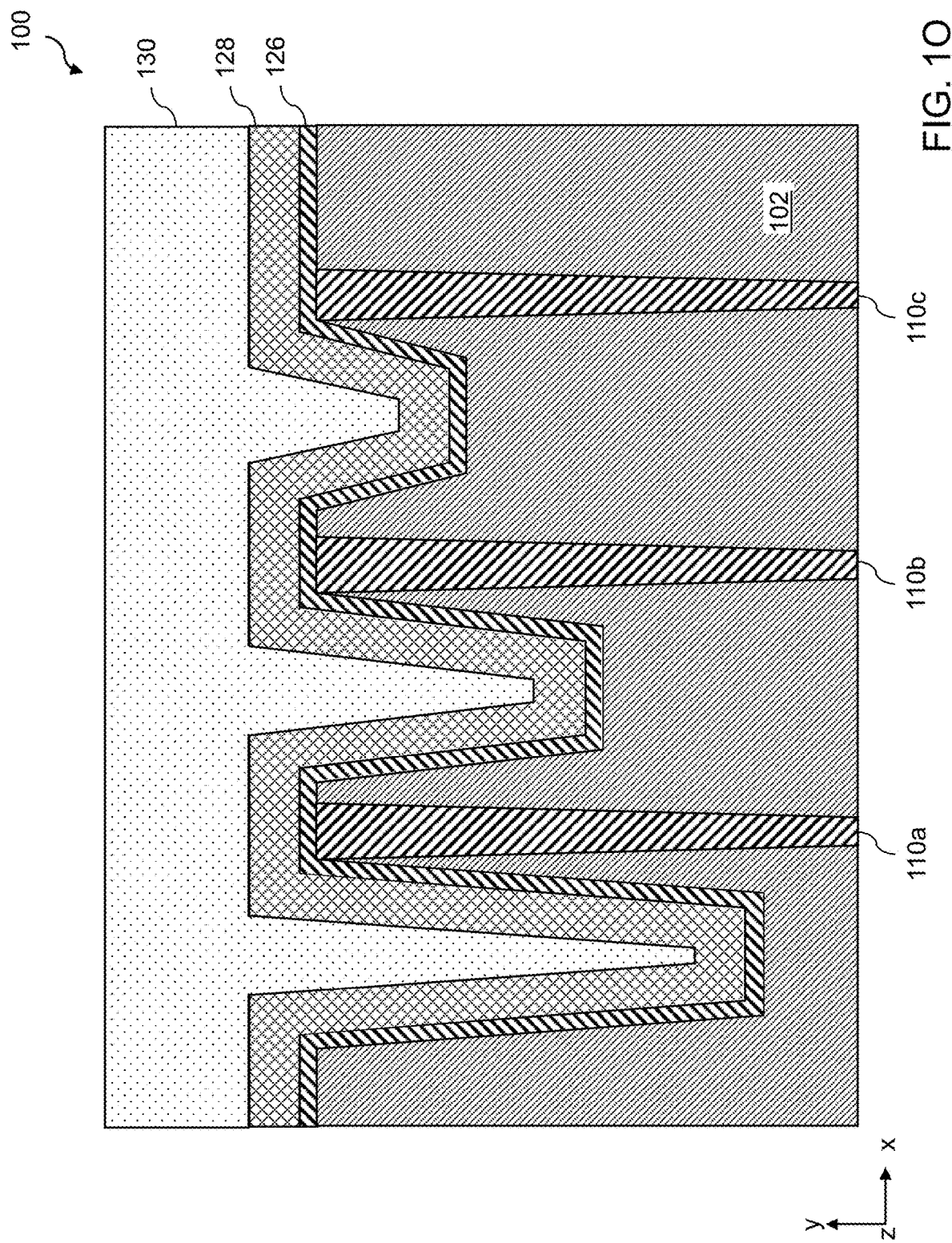

FIG. 1N is a vertical cross-sectional view of a region of the exemplary structure 100 after deposition of a metallic resonance layer 128 according to an embodiment of the present disclosure. Referring to FIG. 1N, the metallic resonance layer 128 may be sequentially deposited over the top surface of metallic barrier layer 126. The metallic resonance layer 128 may include an elemental metal or an intermetallic alloy of at least two elemental metals. In one embodiment, metallic resonance layer 128 may include at least one of tungsten (W), copper (Cu), ruthenium (Ru), molybdenum (Mo), aluminum (Al), aluminum copper (AlCu), or aluminum silicon copper (AlSiCu), alloys thereof, and/or a layer stack thereof. Other suitable elemental metals or intermetallic alloys of at least two elemental metals within the contemplated scope of disclosure may be used. The metallic resonance layer 128 may be deposited by any physical vapor deposition, chemical vapor deposition, electroplating, or electroless plating. In one embodiment, the metallic resonance layer 128 may have a range of thicknesses, such as a thickness that is greater than or equal to 50 angstroms (A), although thicker or thinner metallic resonance layer 128 may be used.

FIG. 1O is a vertical cross-sectional view of the exemplary structure 100 after deposition of a resonator trench dielectric layer 130 according to an embodiment of the present disclosure. Referring to FIG. 1O, the resonator trench dielectric layer 130 may be sequentially deposited over the top surface of metallic resonance layer 128. The resonator trench dielectric layer 130 may fill in trenches formed after depositing the metallic resonance layer 128 as described with reference to FIG. 1N, such that the resonator trench dielectric layer 130 may be in contact with top surfaces and/or sidewalls of the metallic resonance layer 128 within the areas previously defined by the resonator cavities 124a, 124b, 124c. The resonator trench dielectric layer 130 may be deposited by a conformal deposition process (such as a chemical vapor deposition process) or a self-planarizing deposition process (such as spin coating).

In one embodiment, the resonator trench dielectric layer 130 may include undoped silicon glass, doped silicate glass, organosilicate glass, silicon nitride, phosphosilicate glass, fluorosilicate glass, low-k material, extreme low-k material, and black diamond, and/or a layer stack thereof. Other suitable dielectric materials are within the contemplated scope of disclosure. The resonator trench dielectric layer 130 may be implemented as an isolation layer between a capping plate (not shown) and at least a portion of the metallic resonance layer 128 (i.e., any portion of the metallic resonance layer 128 vertically below the resonator trench dielectric layer 130).

Figure 1P:
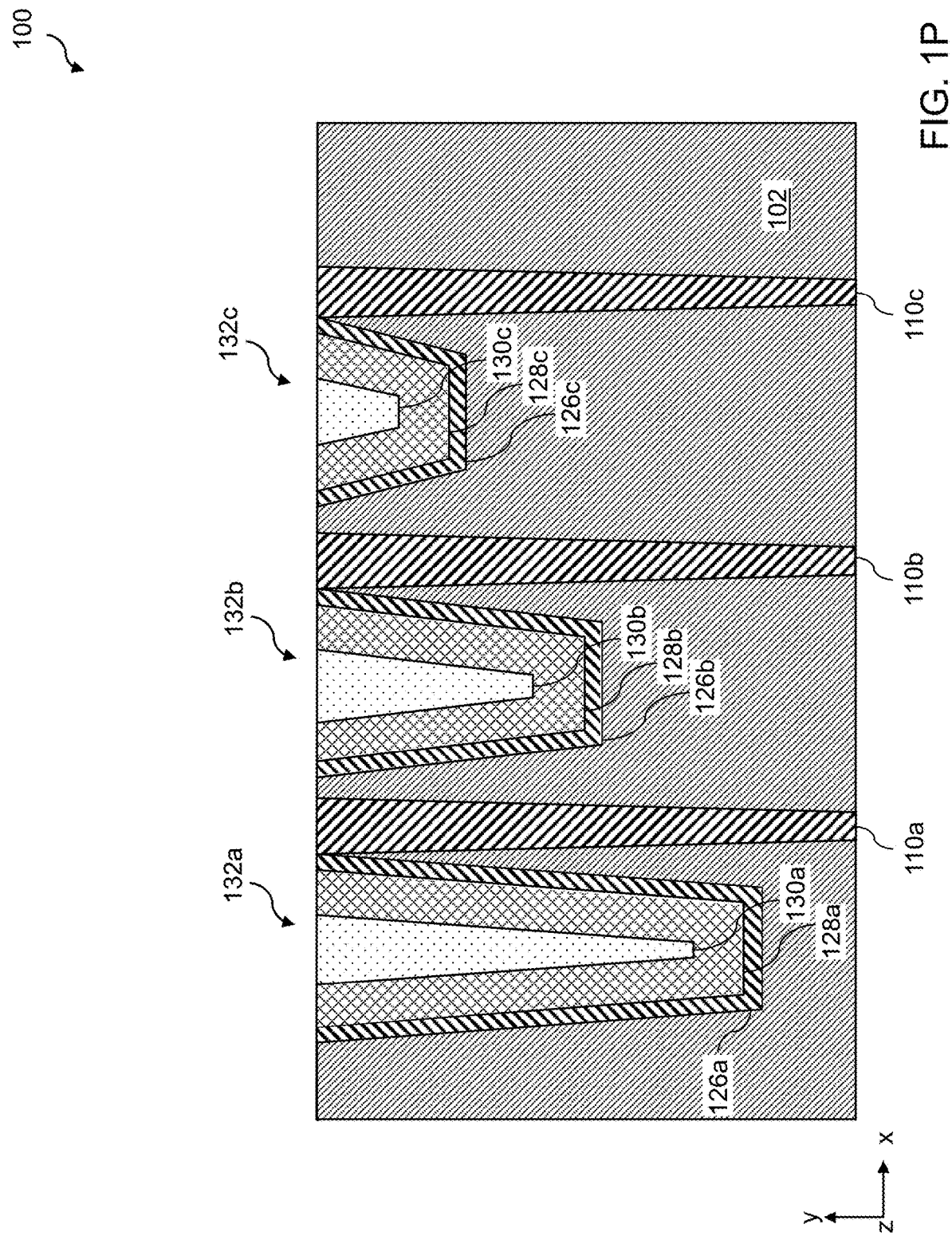
FIG. 1P is a vertical cross-sectional view of the exemplary structure after performing chemical-mechanical polishing (CMP) according to an embodiment of the present disclosure.

FIG. 1P is a vertical cross-sectional view of the exemplary structure 100 after performing CMP according to an embodiment of the present disclosure. Referring to FIG. 1P, a CMP process may remove portions of the metallic barrier layer 126, metallic resonance layer 128, and resonator trench dielectric layer 130. The CMP process may be performed to create a single horizontal plane in which top surfaces of the metallic barrier layer 126, metallic resonance layer 128, resonator trench dielectric layer 130, and base dielectric layer 102 may be exposed.

The CMP process may separate portions of the metallic barrier layer 126, metallic resonance layer 128, and resonator trench dielectric layer 130 to form resonator trenches 132a, 132b, 132c. For example, the CMP process may remove topmost portions of the metallic barrier layer 126, metallic resonance layer 128, and resonator trench dielectric layer 130 to form electrically-separated resonator trenches 132a, 132b, 132c. A first resonator trench 132a may include a metallic barrier layer 126a, a metallic resonance layer 128a, and a first resonator trench dielectric layer 130a. A second resonator trench 132b may include a metallic barrier layer 126b, a metallic resonance layer 128b, and a second resonator trench dielectric layer 130b. A third resonator trench 132c may include a metallic barrier layer 126c, a metallic resonance layer 128c, and a third resonator trench dielectric layer 130c. The metallic barrier layers 126a, 126b, 126c may be electrically isolated from each other, the metallic resonance layers 128a, 128b, 128c may be electrically isolated from each other, and the resonator trench dielectric layers 130a, 130b, 130c may be isolated from each other.

In one embodiment, the CMP process may be performed until a specific layer or semiconductor structure is detected by one or more sensors. For example, the CMP process may be performed, removing topmost portions of the metallic barrier layer 126, metallic resonance layer 128, and resonator trench dielectric layer 130, until a topmost surface of the contact vias 110a, 110b, 110c are exposed and detected. Thus, portions of the metallic barrier layers 126a, 126b, 126c, metallic resonance layers 128a, 128b, 128c, resonator trench dielectric layers 130a, 130b, 130c, and base dielectric layer 102 may be planarized on a same horizontal plane as top surfaces of the contact vias 110a, 110b, 110c.

In one embodiment, the CMP process may be performed until a designated depth is reached, in which the designated depth is based on known depths of resonator trenches 132a, 132b, 132c (i.e., the depths of the metallic barrier layer 126 within the base dielectric layer 102) and depths of the resonator trench dielectric layer 130. For example, a CMP process may stop at a specific known depth to ensure the remaining resonator trench dielectric layers 130a, 130b, 130c have certain thicknesses between exposed, polished top surfaces and bottom surfaces contacting the metallic resonance layers 128a, 128b, 128c respectively.

Figure 1Q:
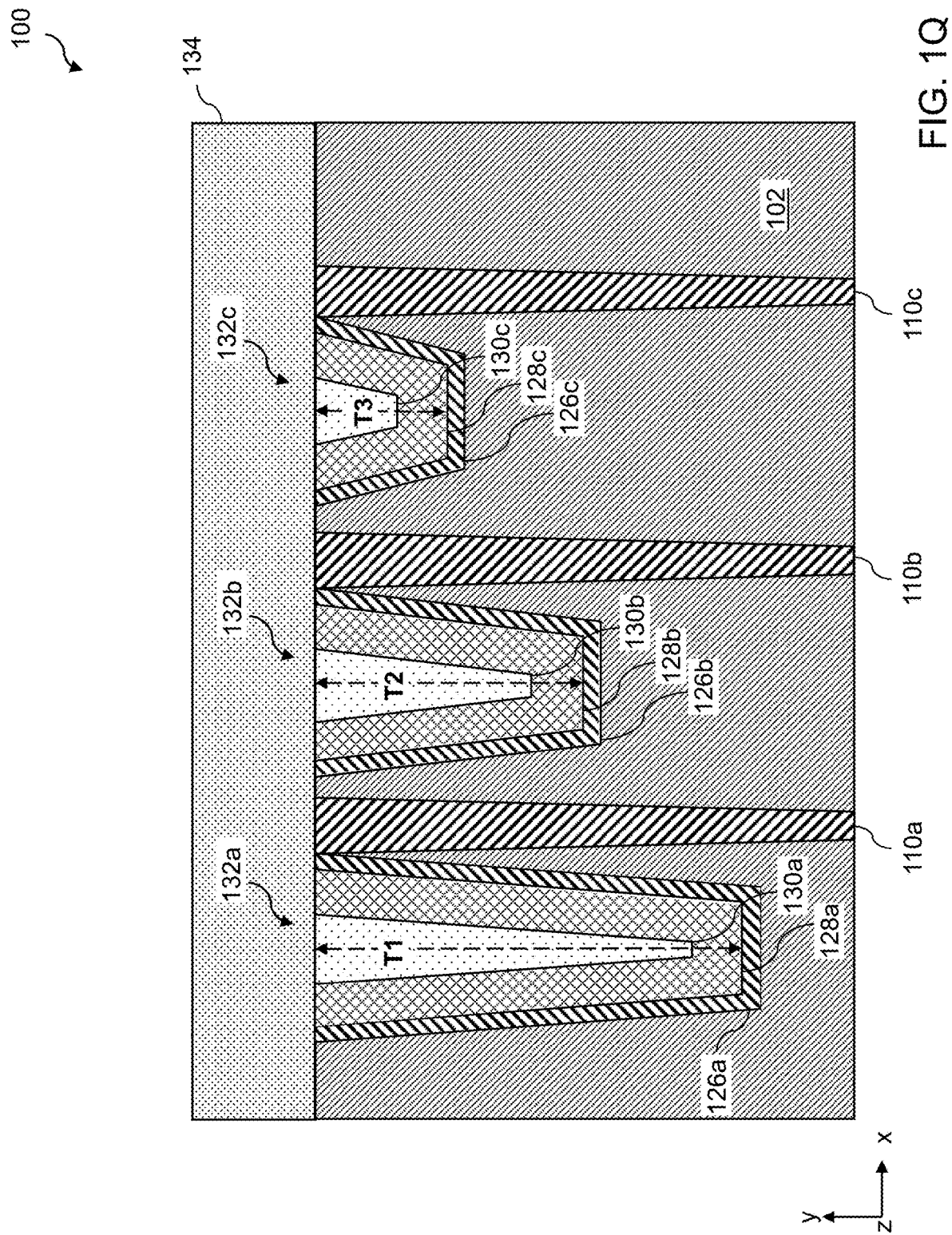
FIG. 1Q is a vertical cross-sectional view of the exemplary structure after deposition of a dielectric isolation layer according to an embodiment of the present disclosure.

FIG. 1Q is a vertical cross-sectional view of the exemplary structure 100 after deposition of a dielectric isolation layer 134 according to an embodiment of the present disclosure. Referring to FIG. 1Q, the dielectric isolation layer 134 may be sequentially deposited over top surface of contact vias 110a, 110b, 110c, and exposed surfaces of resonator trenches 132a, 132b, 132c and the base dielectric layer 102. The dielectric isolation layer 134 may be deposited by a conformal deposition process (such as a chemical vapor deposition process) or a self-planarizing deposition process (such as spin coating).

In one embodiment, the dielectric isolation layer 134 may include undoped silicon glass, doped silicate glass, organosilicate glass, silicon nitride, phosphosilicate glass, fluorosilicate glass, low-k material, extreme low-k material, and black diamond, and/or a layer stack thereof. Other suitable dielectric materials are within the contemplated scope of disclosure. The dielectric isolation layer 134 may be implemented as an isolation layer between a capping plate (not shown) and each of the resonator trenches 132*a*, 132*b*, 132*c*. In some embodiments, the thickness of the metallic resonance layer 128 combined and the resonator trench dielectric layer 130 may be greater than 100 Å. For example, the combined thickness of the metallic resonance layer 128*c* and the third resonator trench dielectric layer 130*c* of the resonator trench 132*c* may be greater than 100 Å, although lesser or equivalent thicknesses may also be used. The thickness of the metallic resonance layer 128 and the resonator trench dielectric layer 130 may be measured as the distance between a bottom surface of the dielectric isolation layer 134 and a top surface of the metallic barrier layer 126 for each resonator trench 132*a*, 132*b*, 132*c*. As illustrated in FIG. 1Q, the metallic resonance layer 128 and the resonator trench dielectric layer 130 may have different combined thicknesses indicated by labels T1, T2, and T3 for each of the resonator trenches 132*a*, 132*b*, 132*c*, in which each thickness T1, T2, and T3 may be greater than 100 Å.

Figure 1R:
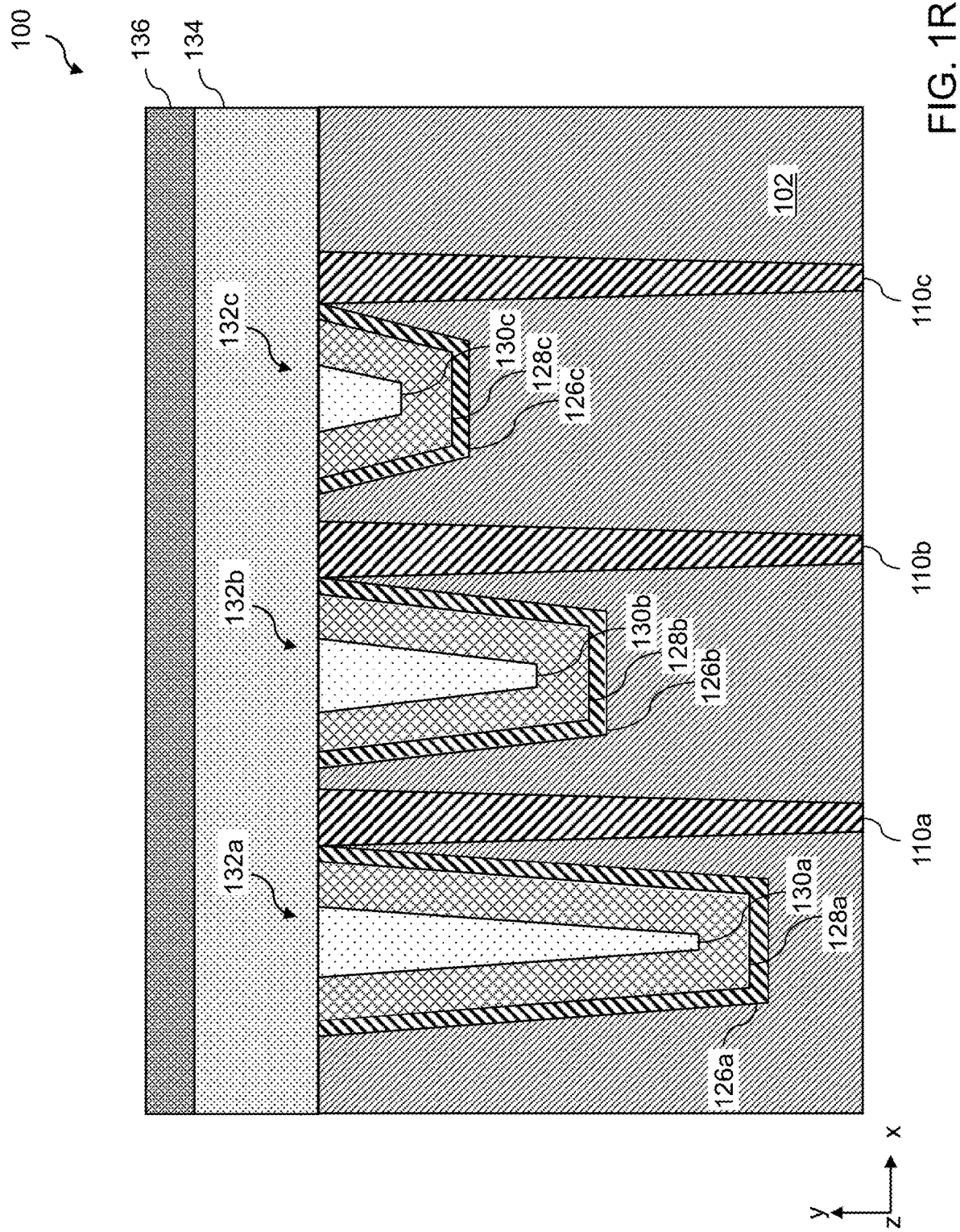
FIG. 1R is a vertical cross-sectional view of the exemplary structure after deposition of a capping plate according to an embodiment of the present disclosure.

FIG. 1R is a vertical cross-sectional view of the exemplary structure 100 after deposition of a capping plate 136 according to an embodiment of the present disclosure. Referring to FIG. 1R, a capping plate 136 may be deposited over the dielectric isolation layer 134. The capping plate 136 may include an elemental metal or an intermetallic alloy of at least two elemental metals. In one embodiment, the capping plate 136 may include W, Cu, Ru, Mo, Al, AlCu, AlSiCu, alloys thereof, and/or a layer stack thereof. Other suitable elemental metal or an intermetallic alloy of at least two elemental metals are within the contemplated scope of disclosure. The capping plate 136 may be deposited by any one of physical vapor deposition, chemical vapor deposition, electroplating, or electroless plating.

In one embodiment, the dielectric constants of the base dielectric layer 102 and the dielectric isolation layer 134 may be the same. In one embodiment, the dielectric constants of the base dielectric layer 102 and the dielectric isolation layer 134 may be different. In one embodiment, the dielectric constants of the base dielectric layer 102, the resonator trench dielectric layers 130*a*, 130*b*, 130*c*, and the dielectric isolation layer 134 may be the same. In some embodiments, the dielectric constants of the resonator trench dielectric layers 130*a*, 130*b*, 130*c* in each resonator trench 132*a*, 132*b*, 132*c* may be the same dielectric constant value. In some embodiments, the resonator trench dielectric layers 130*a*, 130*b*, 130*c* in each resonator trench 132*a*, 132*b*, 132*c* may have different dielectric constant values and/or may be comprised of different dielectric materials. For example, the resonator trench dielectric layer 130*a*, may have a different dielectric constant than resonator trench dielectric layers 130*b*, 130*c*, and the resonator trench dielectric layer 130*b* may have a different dielectric constant than the resonator trench dielectric layer 130*c*.

In some embodiments, the resonator trench dielectric layers 130*a*, 130*b*, 130*c* in each resonator trench 132*a*, 132*b*, 132*c* may be formed using one or more dielectric material layers, such as in a dielectric material stackup deposited sequentially over the metallic resonance layers 128*a*, 128*b*, 128*c*. For example, the resonator trench dielectric layers 130*a*, 130*b*, 130*c* may consist of a series of deposited layers having varying dielectric constants. As another example, the resonator trench dielectric layer 130*a* may consist of a single dielectric layer, the resonator trench dielectric layer 130*b* may consist of a two-dielectric layer stackup in which the dielectric constant of the resonator trench dielectric layer 130*b* is based on the dielectric constants of both layers, and the resonator trench dielectric layer 130*c* may consist of a three-dielectric layer stackup in which the dielectric constant of the resonator trench dielectric layer 130*c* is based on the dielectric constants of all three layers.

The resulting structure 100 may operate as a RF resonator, in which the resonator trenches 132*a*, 132*b*, 132*c* have various resonant frequencies that may be fine-tuned during the manufacturing process based on, but not limited by, the following parameters: (i) the size and shape of the resonator trenches 132*a*, 132*b*, 132*c* including (a) depth of the trench (i.e., distance from a bottom surface of the dielectric isolation layer 134 to a distal end of the metallic barrier layers 126*a*, 126*b*, 126*c*), (b) taper angle of sidewalls of the resonator trenches 132*a*, 132*b*, 132*c*, (c) taper angle of sidewalls of each material layer (e.g., metallic barrier layers 126*a*, 126*b*, 126*c*; metallic resonance layers 128*a*, 128*b*, 128*c*; resonator trench dielectric layers 130*a*, 130*b*, 130*c*), (d) thickness of each material layer, and (e) width of the resonator trenches 132*a*, 132*b*, 132*c*; (ii) dielectric constant and conductivity of the metallic barrier layers 126*a*, 126*b*, 126*c*; (iii) dielectric constant and conductivity of the metallic resonance layers 128*a*, 128*b*, 128*c*; and (iv) dielectric constant of the resonator trench dielectric layers 130*a*, 130*b*, 130*c*.

The structure 100 operating as an RF resonator may function additionally based on, but not limited by, the following parameters: (i) the thickness and conductivity of the capping plate 136; (ii) the thickness and dielectric constant of the dielectric isolation layer 134; (iii) the distances between each pair of resonator trench 132*a*, 132*b*, 132*c* and contact vias 110*a*, 110*b*, 110*c* (e.g., distance between contact via 110*a* and resonator trench 132*b*, distance between contact via 110*b* and resonator trench 132*c*); (iv) the size and shape of the contact vias 110*a*, 110*b*, 110*c*; (v) the total number of resonator trenches within a single resonator structure in general; and (vi) the resonant frequencies of each resonator trench compared to the resonant frequencies of other resonator trenches within a single resonator structure.

In one embodiment, the resonator trenches 132*a*, 132*b*, 132*c* may have a same depth within the base dielectric layer 102, but may exhibit different resonant frequencies as determined by one or more of the aforementioned parameters (e.g., dielectric constant of resonator trench dielectric layers 130*a*, 130*b*, 130*c*). In one embodiment, the resonator trenches 132*a*, 132*b*, 132*c* may have a same shape (e.g., size, sidewall taper angles, depth) but may exhibit different resonant frequencies as determined by one or more of the aforementioned parameters.

The structure 100 may operate as an RF resonator by absorbing, or otherwise receiving RF signals at the capping plate 136 from an external RF source. The capping plate 136 may relay the received RF signals through the dielectric isolation layer 134 towards the resonator trenches 132*a*, 132*b*, 132*c*. The RF signals may continuously propagate throughout the resonator trench dielectric layers 130*a*, 130*b*, 130*c*, which may cause the metallic resonance layers 128*a*, 128*b*, 128*c* to generate electromagnetic fields (EMF) if the frequency of the RF signals is equal to or substantially close to the one or more resonant frequencies of the resonator trenches 132a, 132b, 132c. For example, if an RF signal received at the capping plate 136 has a frequency that is equivalent to or nearly equivalent to one or more resonant frequencies of the resonator trench 132b, but the same RF signal frequency is not equivalent to or close to one or more resonant frequencies of the resonator trenches 132a, 132c, then the resonator trench 132b may generate a large EMF as compared to the EMFs generated by the resonator trenches 132a, 132c. The EMF generated by a propagated RF signal within each resonator trench 132a, 132b, 132c may be converted into voltages in the metallic resonance layers 128a, 128b, 128c. The voltages within the metallic resonance layers 128a, 128b, 128c may be conducted through the metallic barrier layers 126a, 126b, 126c to respective contact vias 110a, 110b, 110c. The contact vias 110a, 110b, 110c may then communicate any voltage to logic device or circuitry within a semiconductor die (e.g., BEOL/FEOL) to process the voltage parameters measured as a result of the received RF signal.

In some examples, the RF resonator structure 100 may operate in reverse of the aforementioned RF measurement process, such that the RF resonator structure may be configured to alternatively or additionally function as an RF emitter. For example, a semiconductor logic device may provide a voltage to one or more contact vias 110a, 110b, 110c. The contact vias 110a, 110b, 110c may transmit the voltage through the metallic barrier layers 126a, 126b, 126c to the metallic resonance layers 128a, 128b, 128c. The metallic resonance layers 128a, 128b, 128c may generate EMFs based on the applied voltage. The EMFs may generate a wave signal that may be directed through the dielectric isolation layer 134 to the capping plate 136. The capping plate 136 may then transmit the RF signal outward and externally from the semiconductor die.

Figure 2:
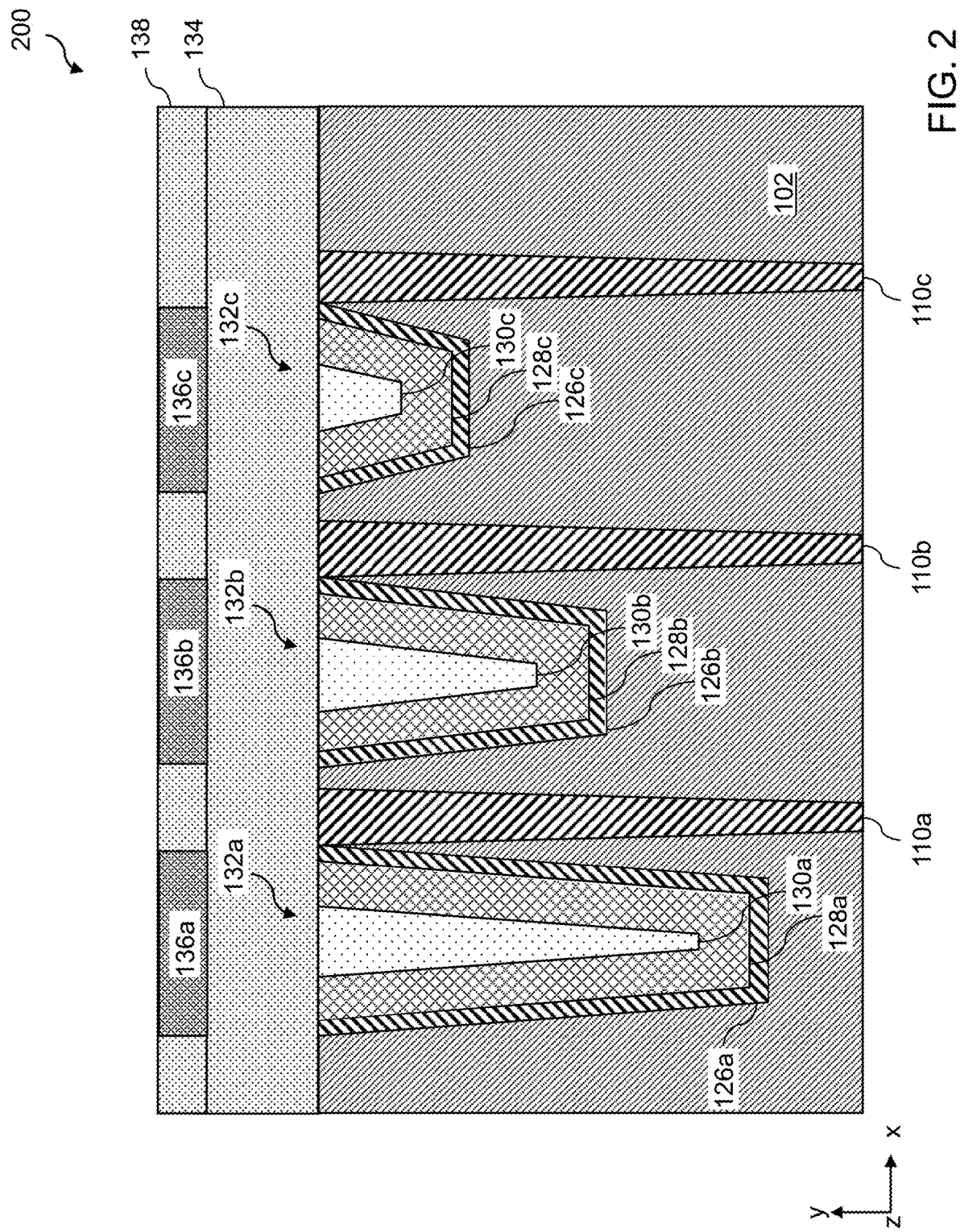
FIG. 2 is a vertical cross-sectional view of a first alternative embodiment of the exemplary structure after formation of multiple capping plates according to an embodiment of the present disclosure.

FIG. 2 is a vertical cross-sectional view of a first alternative embodiment of the exemplary structure 200 after formation of multiple capping plates according to an embodiment of the present disclosure. Referring to FIG. 2, a capping plate material layer, or electrode material layer, layer may be deposited over the dielectric isolation layer 134. The capping plate may be patterned to form a first capping plate 136a, a second capping plate 136b, and a third capping plate 136c. The sidewalls of each of the first capping plate 136a, the second capping plate 136b, and the third capping plate 136c may be at least respectively aligned with or extend past the outer periphery of the resonator trenches 132a, 132b, 132c respectively. For example, the first capping plate 136a may be vertically positioned above the resonator trench 132a, the second capping plate 136b may be vertically positioned above the resonator trench 132b, and the third capping plate 136c may be vertically positioned above the resonator trench 132c.

The first capping plate 136a, the second capping plate 136b, and the third capping plate 136c may include an elemental metal or an intermetallic alloy of at least two elemental metals. In one embodiment, the first capping plate 136a, the second capping plate 136b, and the third capping plate 136c may include W, Cu, Ru, Mo, Al, AlCu, AlSiCu, alloys thereof, and/or a layer stack thereof. Other suitable metal materials are within the contemplated scope of disclosure. The capping plate material layer may be deposited by any one of physical vapor deposition, chemical vapor deposition, electroplating, or electroless plating. The first capping plate 136a, the second capping plate 136b, and the third capping plate 136c may be formed within a dielectric layer 138. In one embodiment, the first capping plate 136a, the second capping plate 136b, and the third capping plate 136c may be formed, and then the dielectric layer 138 may be sequentially deposited around the first capping plate 136a, the second capping plate 136b, and the third capping plate 136c. In an alternative embodiment, the dielectric layer 138 may be deposited, and then the first capping plate 136a, the second capping plate 136b, and the third capping plate 136c may be sequentially formed within the dielectric layer 138 using a pattern and etching process implementing photoresist layers and mask layers.

The first capping plate 136a, the second capping plate 136b, and the third capping plate 136c may create three distinct resonator circuits respectively with the resonator trenches 132a, 132b, 132c. A first resonator may be defined by the first capping plate 136a and the resonator trench 132a, in which resonant frequencies of the first resonator are determined at least by the distance between a bottom surface of the first capping plate 136a and a distal bottom surface of the metallic barrier layer 126a. A second resonator may be defined by the second capping plate 136b and the resonator trench 132b, in which resonant frequencies of the second resonator are determined at least by the distance between a bottom surface of the second capping plate 136b and a distal bottom surface of the metallic barrier layer 126b. A third resonator may be defined by the third capping plate 136c and the resonator trench 132c, in which resonant frequencies of the third resonator are determined at least by the distance between a bottom surface of the third capping plate 136c and a distal bottom surface of the metallic barrier layer 126c. Thus, the first resonator, second resonator, and third resonator may each exhibit different resonant frequencies depending on depths of the resonator trenches in relation to the capping plates 136a, 136b, 136c respectively.

Figure 3:
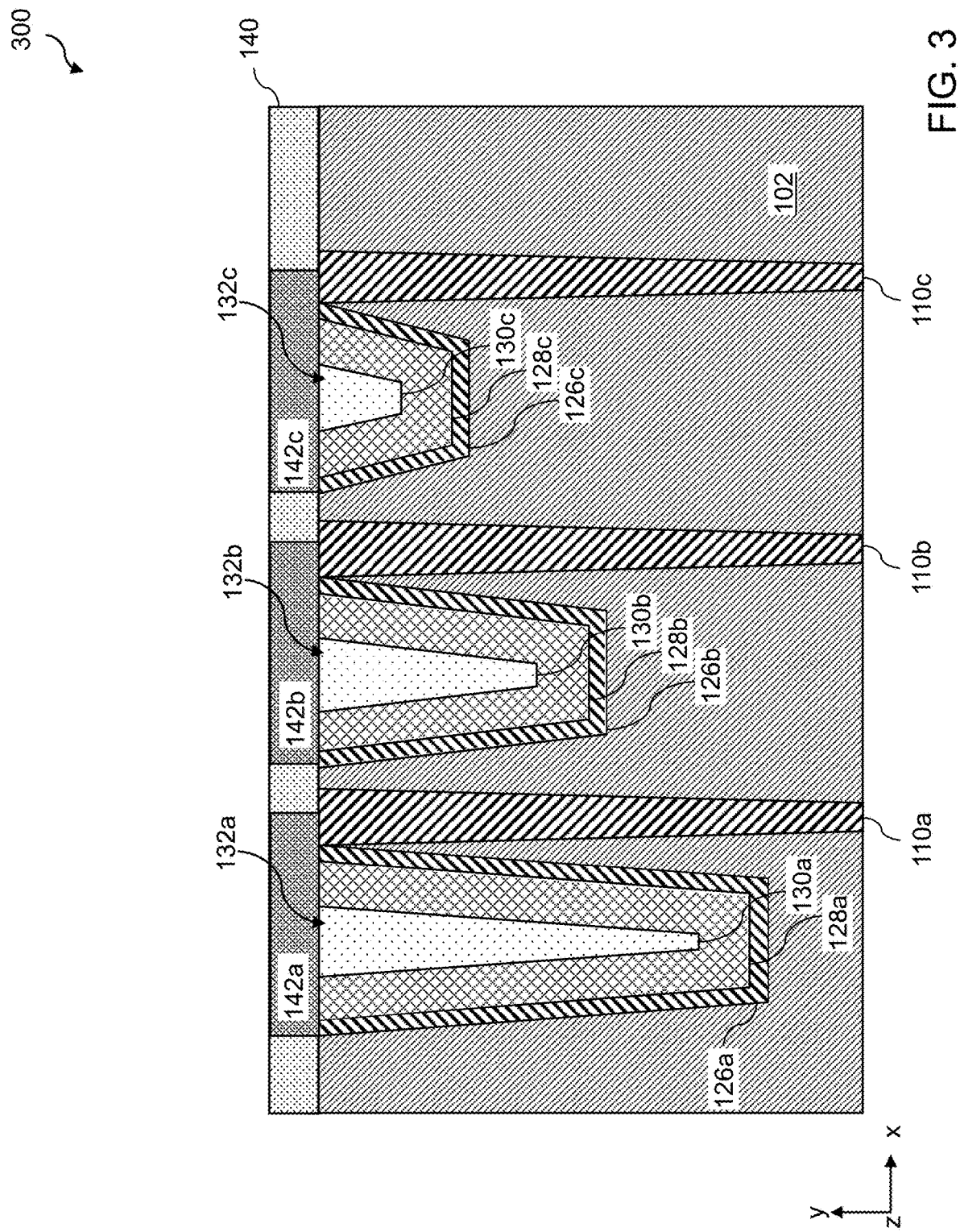
FIG. 3 is a vertical cross-sectional view of a second alternative embodiment of the exemplary structure after formation of multiple capping plates according to an embodiment of the present disclosure.

FIG. 3 is a vertical cross-sectional view of a second alternative embodiment of the exemplary structure 300 after formation of multiple capping plates according to an embodiment of the present disclosure. A capping plate material layer, or electrode material layer, layer may be deposited directly over the resonator trenches 132a, 132b, 132c after performing the CMP process as described with reference to FIG. 1P. Referring to FIG. 3, the capping plate may be patterned to form a first capping plate 142a, a second capping plate 142b, and a third capping plate 142c. The first capping plate 142a, the second capping plate 142b, and the third capping plate 142c may be in direct electrical connection with the metallic barrier layers 126a, 126b, 126c, metallic resonance layers 128a, 128b, 128c, and contact vias 110a, 110b, 110c of the resonator trenches 132a, 132b, 132c respectively. The first capping plate 142a, the second capping plate 142b, and the third capping plate 142c may therefore enclose the resonator trench dielectric layers 130a, 130b, 130c respectively. For example, the first capping plate 142a may be deposited directly on top of both ends of the metallic barrier layer 126a, both ends of the metallic resonance layer 128a, and at least a portion of the contact via 110a to isolate the resonator trench dielectric layer 130a and to form an electrical pathway between the first capping plate 142a, the resonator trench 132a, and the contact via 110a. The sidewalls of each of the first capping plate 142a, the second capping plate 142b, and the third capping plate 142c may be at least respectively aligned with or extend past the outer periphery of the resonator trenches 132a, 132b, 132c and contact vias 110a, 110b, 110c respectively.

The first capping plate 142a, the second capping plate 142b, and the third capping plate 142c may include an elemental metal or an intermetallic alloy of at least two elemental metals. In one embodiment, the first capping plate 142a, the second capping plate 142b, and the third capping plate 142c may include W, Cu, Ru, Mo, Al, AlCu, AlSiCu, alloys thereof, and/or a layer stack thereof. Other suitable metal materials are within the contemplated scope of disclosure. The capping plate material layer may be deposited by any one of physical vapor deposition, chemical vapor deposition, electroplating, or electroless plating. The first capping plate 142a, the second capping plate 142b, and the third capping plate 142c may be formed within a dielectric layer 140. In one embodiment, the first capping plate 142a, the second capping plate 142b, and the third capping plate 142c may be formed, and then the dielectric layer 140 may be sequentially deposited around the first capping plate 142a, the second capping plate 142b, and the third capping plate 142c. In an alternative embodiment, the dielectric layer 140 may be deposited, and then the first capping plate 142a, the second capping plate 142b, and the third capping plate 142c may be sequentially formed within the dielectric layer 140 using a pattern and etching process implementing photoresist layers and mask layers.

The first capping plate 142a, the second capping plate 142b, and the third capping plate 142c may create three distinct resonator circuits respectively with the resonator trenches 132a, 132b, 132c. A first resonator may be defined by the first capping plate 142a and the resonator trench 132a, in which resonant frequencies of the first resonator are determined at least by the distance between a bottom surface of the first capping plate 142a and a distal bottom surface of the metallic barrier layer 126a. A second resonator may be defined by the second capping plate 142b and the resonator trench 132b, in which resonant frequencies of the second resonator are determined at least by the distance between a bottom surface of the second capping plate 142b and a distal bottom surface of the metallic barrier layer 126b. A third resonator may be defined by the third capping plate 142c and the resonator trench 132c, in which resonant frequencies of the third resonator are determined at least by the distance between a bottom surface of the third capping plate 142c and a distal bottom surface of the metallic barrier layer 126c. Thus, the first resonator, second resonator, and third resonator may each exhibit different resonant frequencies depending on depths of the resonator trenches in relation to the capping plates 142a, 142b, 142c respectively.

Figure 4:
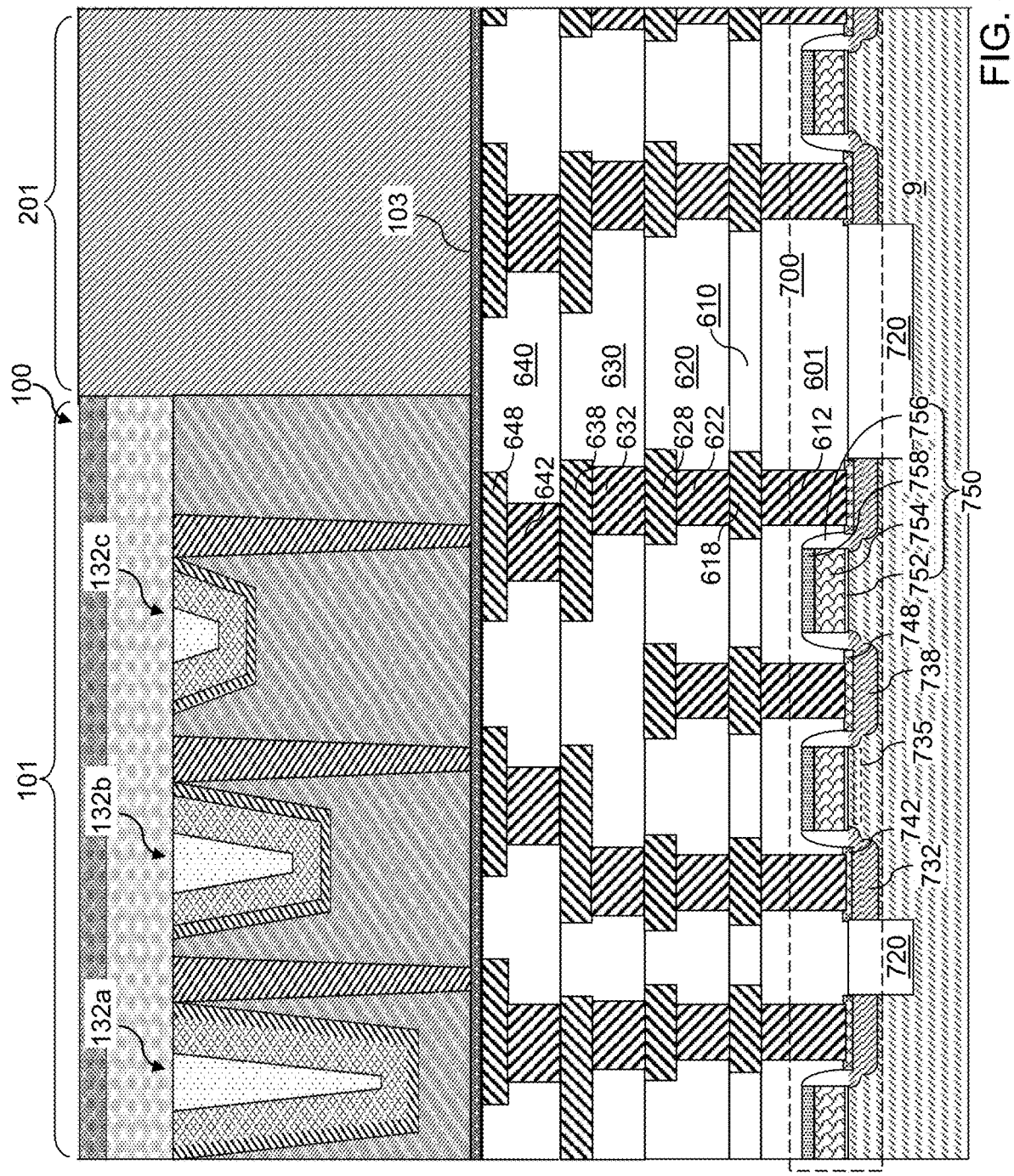
FIG. 4 is a vertical cross-sectional view of an exemplary structure after formation of complementary metal-oxide-semiconductor (CMOS) transistors and metal interconnect structures formed in dielectric material layers according to an embodiment of the present disclosure.

Referring to FIG. 4, an exemplary structure according to an embodiment of the present disclosure is illustrated. FIG. 4 is a vertical cross-sectional view of an exemplary structure after formation of complementary metal-oxide-semiconductor (CMOS) transistors and metal interconnect structures formed in dielectric material layers during a front-end-of-line (FEOL) process according to an embodiment of the present disclosure. The exemplary structure includes a substrate 9, which may be a semiconductor substrate such as a commercially available silicon substrate. Shallow trench isolation structures 720 including a dielectric material such as silicon oxide may be formed in an upper portion of the substrate 9. Suitable doped semiconductor wells, such as p-type wells and n-type wells, may be formed within each area that is laterally enclosed by a portion of the shallow trench isolation structures 720. Field effect transistors may be formed over the top surface of the substrate 9. For example, each field effect transistor may include a source region 732, a drain region 738, a semiconductor channel 735 that includes a surface portion of the substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

The exemplary structure may include a resonator trench region 101 in which an array of resonator trenches may be subsequently formed, and a logic region 201 in which logic devices that support operation of the array of resonator elements may be formed. In one embodiment, devices (such as RF resonators) in the resonator trench region 101 may include resonator trenches (e.g., resonator trenches 132a, 132b, 132c) that communicate voltages converted from EMFs generated by received RF signals to transistor structures electrically connected to the contact vias 110a, 110b, 110c. Supporting structures such as logic or memory devices may be formed in the logic region 201. Devices (such as field effect transistors) in the logic region 201 may provide functions that are needed to operate the array of resonator trenches to be subsequently formed. Specifically, devices in the logic region 201 may be configured to control the operation of the array of resonator trenches. The devices formed on the top surface of the substrate 9 may include complementary metal-oxide-semiconductor (CMOS) transistors and optionally additional semiconductor devices (such as resistors, diodes, capacitors, etc.), and are collectively referred to as CMOS circuitry 700.

Various metal interconnect structures formed in dielectric material layers may be subsequently formed over the substrate 9 and the devices (such as field effect transistors). The dielectric material layers may include, for example, a contact-level dielectric material layer 601, a first interconnect-level dielectric material layer 610, a second interconnect-level dielectric material layer 620, a third interconnect-level dielectric material layer 630, and a fourth interconnect-level dielectric material layer 640. The metal interconnect structures may include device contact via structures 612 formed in the contact-level dielectric material layer 601 and contact a respective component of the CMOS circuitry 700, first line structures 618 formed in the first interconnect-level dielectric material layer 610, first via structures 622 formed in a lower portion of the second interconnect-level dielectric material layer 620, second line structures 628 formed in an upper portion of the second interconnect-level dielectric material layer 620, second via structures 632 formed in a lower portion of the third interconnect-level dielectric material layer 630, third line structures 638 formed in an upper portion of the third interconnect-level dielectric material layer 630, third via structures 642 formed in a lower portion of the fourth interconnect-level dielectric material layer 640, and fourth line structures 648 formed in an upper portion of the fourth interconnect-level dielectric material layer 640. In one embodiment, the second line structures 628 may include source lines that are connected a source-side power supply for an array of resonator elements. The voltage provided by the source lines may be applied to the electrodes (e.g., contact vias 110a, 110b, 110c) through the access transistors provided in the resonator trench region 101.

Each of the contact-level and interconnect-level dielectric layers (601, 610, 620, 630, 640) may include a dielectric material such as undoped silicate glass, doped silicate glass, organosilicate glass, amorphous fluorinated carbon, porous variants thereof, or combinations thereof. Each of the interconnect structures (612, 618, 622, 628, 632, 638, 642, 648) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first via structures 622 and the second line structures 628 may be formed as integrated line and via structures by a dual damascene process, the second via structures 632 and the third line structures 638 may be formed as integrated line and via structures, and/or the third via structures 642 and the fourth line structures 648 may be formed as integrated line and via structures. While the present disclosure is described using an embodiment in which an array of resonator trenches formed over the fourth interconnect-level dielectric material layer 640, embodiments are expressly contemplated herein in which the array of resonator trenches may be formed at a different interconnect level.

A cap layer 103 may be formed over the metal interconnect structures and the interconnect dielectric material layers. For example, the cap layer 103 may be formed on the top surfaces of the fourth line structures 648 and on the top surface of the fourth interconnect-level dielectric material layer 640. The cap layer 103 may include a dielectric capping material that may protect underlying metal interconnect structures such as the fourth line structures 648. In one embodiment, the cap layer 103 may include a material that may provide high etch resistance, i.e., a dielectric material, and also may function as an etch stop material during a subsequent anisotropic etch process that etches the base dielectric layer 102. For example, the cap layer 103 may include silicon carbide or silicon nitride, and may have a thickness in a range from 5 nm to 30 nm, although lesser and greater thicknesses may also be used.

The cap layer 103 and the base dielectric layer 102 may be formed as planar blanket (unpatterned) layers having a respective planar top surface and a respective planar bottom surface that extends throughout the resonator trench region 101 and the logic region 201. The cap layer 103 and the base dielectric layer 102 may be etched to form contact via cavities in which contact vias 110a, 110b, 110c may be formed. The resonator trenches 132a, 132b, 132c, dielectric isolation layer 134, and capping plate 136 of the structure 100 may be formed according to various embodiments as described with reference to FIGS. 1A-3.

Figure 5:
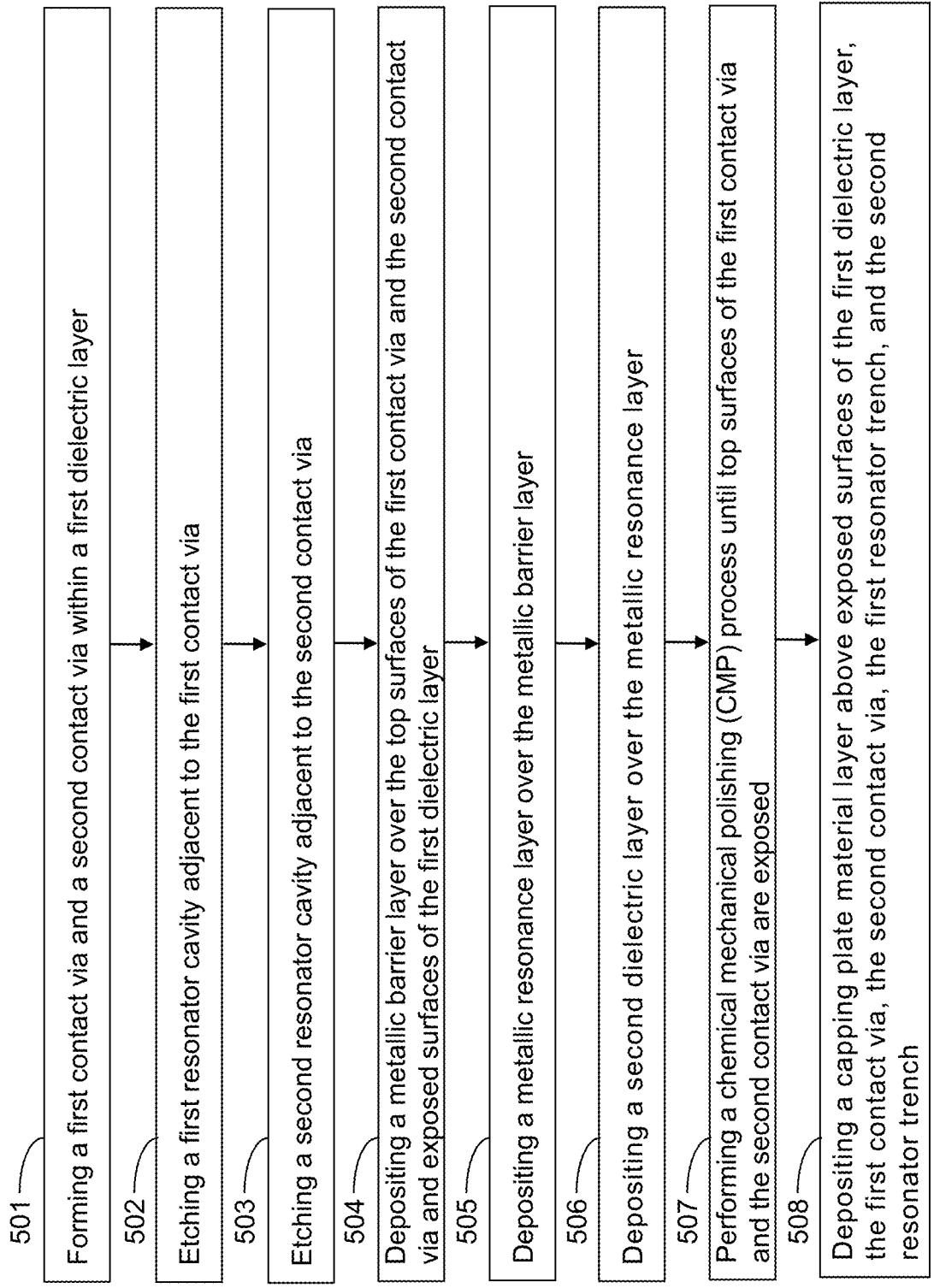
FIG. 5 is a flowchart that illustrates the general processing steps for forming a semiconductor structure according to an embodiment of the present disclosure.

FIG. 5 is a flowchart that illustrates the general processing steps for forming a semiconductor structure 100 according to an embodiment of the present disclosure. Referring to step 501 and FIGS. 1A-1F, a first contact via 110a and a second contact via 110b may be formed within a base dielectric layer 102. Referring to step 502 and FIGS. 1G-1L, a first resonator cavity 124a may be etched adjacent to the first contact via 110a. Referring to step 503 and FIG. 1G-1L, a second resonator cavity 124b may be etched adjacent to the second contact via 110b, in which the second resonator cavity 124b may have a different depth than the first resonator cavity 124a. Referring to step 504 and FIG. 1M, a metallic barrier layer 126 may be deposited over top surfaces of the first contact via 110a and the second contact via 110b and exposed surfaces of the base dielectric layer 102. Referring to step 505 and FIG. 1N, a metallic resonance layer 128 may be deposited over the metallic barrier layer 126. Referring to step 506 and FIG. 1O, a resonator trench dielectric layer 130 may be deposited over the metallic resonance layer 128. Referring to step 507 and FIG. 1P, a CMP process may be performed until top surfaces of the first contact via 110a and the second contact via 110b are exposed, in which the CMP process may physically separate portions of the metallic barrier layer 126 and the metallic resonance layer 128 to form a first resonator trench 132a including a first metallic barrier layer 126a, a first metallic resonance layer 128a, and a first resonator trench dielectric layer 130a, and a second resonator trench 132b including a second metallic barrier layer 126b, a second metallic resonance layer 128b, and a second resonator trench dielectric layer 130b. Referring to step 508 and FIGS. 1R, 2, and 3, a capping plate material layer 136 may be deposited above exposed surfaces of the base dielectric layer 102, the first contact via 110a, the second contact via 110b, the first resonator trench 132a, and the second resonator trench 132b.

In one embodiment, referring to FIG. 1Q a dielectric isolation layer 134 may be deposited on top of exposed surfaces of the base dielectric layer 102, the first contact via 110a, the second contact via 110b, the first resonator trench 132a, and the second resonator trench 132b, in which the dielectric isolation layer 134 may be positioned beneath the capping plate material layer.

In one embodiment, referring to FIGS. 2 and 3, the capping plate material layer may be patterned to form a first capping plate (e.g., 136a, 142a) and a second capping plate (e.g., 136b, 142b), in which the first capping plate (e.g., 136a, 142a) may be positioned above the first resonator trench 132a, and in which the second capping plate (e.g., 136b, 142b) may be positioned above the second resonator trench 132b.

In one embodiment, referring to FIGS. 1A-1L a third contact via 110c may be formed within the base dielectric layer 102, and a third resonator cavity 124c may be etched adjacent to the third contact via 110c, in which the third resonator cavity 124c may have a different depth than the second resonator cavity 124b.

In one embodiment, a first distance between a bottom surface of the capping plate material layer and a distal end of the first metallic resonance layer 128a may be greater than 100 Å, and a second distance between the bottom surface of the capping plate material layer and a distal end of the second metallic resonance layer 128b may be greater than 100 Å.

Referring to all drawings and according to various embodiments of the present disclosure, a semiconductor structure is provided. The semiconductor structure may include a first resonator comprising a first metallic resonance layer 128a and a capping plate 136 having a bottom surface that is a first distance from a distal end of the first metallic resonance layer 128a. The semiconductor structure may further include a second resonator including a second metallic resonance layer 128b, and the capping plate 136, in which the bottom surface is a second distance from a from a distal end of the second metallic resonance layer 128b, and in which the first distance is different from the second distance.

In one embodiment, the first metallic resonance layer 128a may be in a first trench shape having first sidewalls, and the second metallic resonance layer 128b may be in a second trench shape having second sidewalls. The first resonator may further include a first resonator trench dielectric layer (e.g., resonator trench dielectric layer 130a) embedded between the first sidewalls of the first metallic resonance layer 128a, and the second resonator may further include a second resonator trench dielectric layer (e.g., resonator trench dielectric layer 130b) embedded between the second sidewalls of the second metallic resonance layer 128b.

In one embodiment, the first resonator trench dielectric layer (e.g., resonator trench dielectric layer 130a) and the second resonator trench dielectric layer (e.g., resonator trench dielectric layer 130b) may have different dielectric constants. In one embodiment, the first resonator trench dielectric layer (e.g., resonator trench dielectric layer 130a) and the second resonator trench dielectric layer (e.g., resonator trench dielectric layer 130b) may have the same dielectric constant. In one embodiment, the first resonator trench dielectric layer (e.g., resonator trench dielectric layer 130a) and the second resonator trench dielectric layer (e.g., resonator trench dielectric layer 130b) may include at least one of undoped silicon glass, silicon nitride, phosphosilicate glass, fluorosilicate glass, low-k material, extreme low-k material, or black diamond.

In one embodiment, the semiconductor structure may further include a base dielectric layer 102 in which the first metallic resonance layer 128a and the second metallic resonance layer 128b are embedded, in which a top surface of the base dielectric layer 102 may be on a same horizontal plane as top surfaces of the first metallic resonance layer 128a and the second metallic resonance layer 128b. In one embodiment, the first resonator may further include a dielectric isolation layer 134 positioned between the capping plate 136 and the first metallic resonance layer 128a, and the second resonator may further include the dielectric isolation layer 134 positioned between the capping plate 136 and the second metallic resonance layer 128b.

In one embodiment, the semiconductor structure may further include a third resonator including a third metallic resonance layer 128c and the capping plate 136, in which the bottom surface is a third distance from a from a distal end of the third metallic resonance layer 128c, and in which the third distance is different from the first distance and the second distance.

In one embodiment the semiconductor structure may further include a first contact via 110a, a first metallic barrier layer 126a electrically connecting the first contact via 110a and the first metallic resonance layer 128a, a second contact via 110b, and a second metallic barrier layer 126b electrically connecting the second contact via 110b and the second metallic resonance layer 128b.

Referring to all drawings and according to various embodiments of the present disclosure, a semiconductor structure is provided, which may include a first resonator and a second resonator. The first resonator may include a first metallic resonance layer 128a and a first capping plate (e.g., 136a, 142a) having a bottom surface that is a first distance from a distal end of the first metallic resonance layer 128a. The second resonator may include a second metallic resonance layer 128b and a second capping plate (e.g., 136b, 142b) having a bottom surface that is a second distance from a distal end of the second metallic resonance layer 128b, in which the first distance is different from the second distance.

In one embodiment, the first capping plate (e.g., 136a, 142a) may be positioned vertically above the first metallic resonance layer 128a, the second capping plate (e.g., 136b, 142b) may be positioned vertically above the second metallic resonance layer 128b, the first capping plate (e.g., 136a, 142a) may be on a same horizontal plane as the second capping plate (e.g., 136b, 142b). In one embodiment, the first capping plate (e.g., 136a, 142a) may be positioned directly on top of the first metallic resonance layer 128a and may be electrically connected to the first metallic resonance layer 128a, and the second capping plate (e.g., 136b, 142b) may be positioned directly on top of the second metallic resonance layer 128b and may be electrically connected to the second metallic resonance layer 128b.

In one embodiment, the first resonator may further include a dielectric isolation layer 134 positioned between the first capping plate (e.g., 136a) and the first metallic resonance layer 128a, and the second resonator may further include the dielectric isolation layer 134 positioned between the second capping plate (e.g., 136b) and the second metallic resonance layer 128b. In one embodiment, the semiconductor structure may further include a third resonator including a third metallic resonance layer 128c and a third capping plate (e.g., 136c, 142c) having a bottom surface that is a third distance from a distal end of the third metallic resonance layer 128c, in which the third distance is different from the first distance and the second distance. In one embodiment, the first metallic resonance layer 128a and the second metallic resonance layer 128b each may include at least one of W, Cu, Ru, Mo, Al, AlCu, or AlSiCu.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
    forming a first contact via and a second contact via within a base dielectric layer;
    etching a first resonator cavity adjacent to the first contact via;
    etching a second resonator cavity adjacent to the second contact via, wherein the second resonator cavity has a different depth than the first resonator cavity;
    depositing a metallic barrier layer over top surfaces of the first contact via and the second contact via and exposed surfaces of the base dielectric layer;
    depositing a metallic resonance layer over the metallic barrier layer;
    depositing a resonator trench dielectric layer over the metallic resonance layer;
    performing a chemical mechanical polishing (CMP) process until top surfaces of the first contact via and the second contact via are exposed, wherein the CMP process physically separates portions of the metallic barrier layer and the metallic resonance layer to form a first resonator trench including a first metallic barrier layer, a first metallic resonance layer, and a first resonator trench dielectric layer, and a second resonator trench including a second metallic barrier layer, a second metallic resonance layer, and a second resonator trench dielectric layer; and
    depositing a capping plate material layer above exposed surfaces of the base dielectric layer, the first contact via, the second contact via, the first resonator trench, and the second resonator trench.

2. The method of claim 1, further comprising:
    depositing a dielectric isolation layer on top of exposed surfaces of the base dielectric layer, the first contact via, the second contact via, the first resonator trench, and the second resonator trench, wherein the dielectric isolation layer is positioned beneath the capping plate material layer.

3. The method of claim 1, further comprising:
patterning the capping plate material layer to form a first capping plate and a second capping plate wherein the first capping plate is positioned above the first resonator trench, and wherein the second capping plate is positioned above the second resonator trench.

4. The method of claim 1, further comprising:
forming a third contact via within the base dielectric layer; and
etching a third resonator cavity adjacent to the third contact via, wherein the third resonator cavity has a different depth than the second resonator cavity.

5. The method of claim 1, wherein a first distance between a bottom surface of the capping plate material layer and a distal end of the first metallic resonance layer is greater than 100 Å, and wherein a second distance between the bottom surface of the capping plate material layer and a distal end of the second metallic resonance layer is greater than 100 Å.

6. A method of forming a semiconductor structure, the method comprising:
forming a first resonator cavity in a base dielectric layer;
forming a second resonator cavity in the base dielectric layer;
forming a first metallic resonance layer in the first resonator cavity;
forming a second metallic resonance layer in the second resonator cavity;
forming a first capping layer over the first resonator cavity;
forming a second capping layer over the second resonator cavity, wherein the first capping layer and the second capping layer and separate from one another;
forming a first contact via in the base dielectric layer such that the first contact via is electrically connected to the first metallic barrier layer; and
forming a second contact via in the base dielectric layer such that the second contact via is electrically connected to the second metallic barrier layer.

7. The method of claim 6, further comprising:
forming a first metallic barrier layer within the first resonator cavity prior to forming the first metallic resonance layer; and
forming a second metallic barrier layer within the second resonator cavity prior to forming the first metallic resonance layer.

8. The method of claim 7, further comprising:
forming a first resonator trench dielectric layer over the first metallic resonance layer; and
forming a second resonator trench dielectric layer over the second metallic resonance layer.

9. The method of claim 6, wherein:
forming the first capping layer over the first resonator cavity further comprises positioning the first capping layer directly over the first metallic resonance layer and electrically connecting the first capping layer to the first metallic resonance layer; and
forming the second capping layer over the second resonator cavity further comprises positioning the second capping layer directly over the second metallic resonance layer and electrically connecting the second capping layer to the second metallic resonance layer.

10. The method of claim 6, further comprising:
forming a dielectric isolation layer over the first resonator cavity and the second resonator cavity such that the dielectric isolation layer is positioned below the first capping layer and the second capping layer and above the first resonator cavity and the second resonator cavity.

11. The method of claim 6, wherein forming the first metallic resonance layer in the first resonator cavity further comprises forming the first metallic resonance layer to comprises a first distal end that is a first distance from a bottom surface of the first capping layer and the second capping layer; and
wherein forming the second metallic resonance layer in the second resonator cavity further comprises forming the second metallic resonance layer to comprises a second distal end that is a second distance from a bottom surface of the first capping layer and the second capping layer.

12. The method of claim 6, wherein the first capping plate aligns with an outer periphery of the first resonator cavity and the second capping plate aligns with an outer periphery of the second resonator cavity.

13. The method of claim 6, wherein the first capping plate extends past an outer periphery of the first resonator cavity and the second capping plate extends past an outer periphery of the second resonator cavity.

14. The method of claim 6, wherein forming the first capping layer over the first resonator cavity further comprises positioning the first capping layer directly over the first metallic resonance layer and electrically connecting the first capping layer to the first metallic resonance layer.

15. A method of forming a semiconductor structure, the method comprising:
performing an anisotropic etch process to form deep via cavities in a base dielectric layer;
deposit a metallic fill material in each of the deep via cavities to form contact vias;
etching a first resonator cavity adjacent to the first contact via;
etching a second resonator cavity adjacent to the second contact via, wherein the second resonator cavity has a different depth than the first resonator cavity;
depositing a metallic barrier layer over top surfaces of the first resonator cavity, the second resonator cavity, the first contact via and the second contact via and exposed surfaces of the base dielectric layer;
depositing a metallic resonance layer over the metallic barrier layer;
depositing a resonator trench dielectric layer over the metallic resonance layer;
performing a chemical mechanical polishing (CMP) process until top surfaces of the first contact via and the second contact via are exposed, wherein the CMP process physically separates portions of the metallic barrier layer and the metallic resonance layer to form a first resonator trench including a first metallic barrier layer, a first metallic resonance layer, and a first resonator trench dielectric layer, and a second resonator trench including a second metallic barrier layer, a second metallic resonance layer, and a second resonator trench dielectric layer, and further wherein the first metallic barrier layer is in contact with the first contact via and the second metallic barrier layer is in contact with the second contact via; and
depositing a capping plate material layer above exposed surfaces of the base dielectric layer, the first contact via, the second contact via, the first resonator trench, and the second resonator trench.

16. The method of claim 15, further comprising:
depositing a dielectric isolation layer on top of exposed surfaces of the base dielectric layer, the first contact via, the second contact via, the first resonator trench, and the second resonator trench, wherein the dielectric isolation layer is positioned beneath the capping plate material layer.

17. The method of claim 15, further comprising:
patterning the capping plate material layer to form a first capping plate and a second capping plate wherein the first capping plate is positioned above the first resonator trench, and wherein the second capping plate is positioned above the second resonator trench.

18. The method of claim 15, wherein the capping plate material layer is deposited directly over the first resonator trench and the second resonator trench.

19. The method of claim 18, further comprising:
patterning the capping plate material layer to form a first capping plate and a second capping plate wherein the first capping plate is positioned above the first resonator trench, and wherein the second capping plate is positioned above the second resonator trench and wherein the first capping plate forms an electrical pathway between the first capping plate, the first resonator trench and the first contact via.

20. The method of claim 15, further comprising:
forming a third contact via within the base dielectric layer; and
etching a third resonator cavity adjacent to the third contact via, wherein the third resonator cavity has a different depth than the second resonator cavity.

\* \* \* \* \*